(12) United States Patent
Brown et al.

(10) Patent No.: US 7,244,125 B2
(45) Date of Patent: Jul. 17, 2007

(54) CONNECTOR FOR MAKING ELECTRICAL CONTACT AT SEMICONDUCTOR SCALES

(75) Inventors: Dirk D. Brown, Mountain View, CA (US); John D. Williams, Campbell, CA (US); Eric M. Radza, San Jose, CA (US)

(73) Assignee: Neoconix, Inc., Sunnyvale, CA (US)

( * ) Notice: Subject to any disclaimer, the term of this patent is extended or adjusted under 35 U.S.C. 154(b) by 0 days.

(21) Appl. No.: 10/731,669

(22) Filed: Dec. 8, 2003

(65) Prior Publication Data

US 2005/0124181 A1     Jun. 9, 2005

(51) Int. Cl.
*H01R 12/00* (2006.01)

(52) U.S. Cl. ............................ 439/66; 439/74

(58) Field of Classification Search ............. 439/66, 439/591, 74; 361/772, 773, 774; 174/260, 174/261, 262, 263, 264
See application file for complete search history.

(56) References Cited

U.S. PATENT DOCUMENTS

| | | | |
|---|---|---|---|
| 3,543,587 A | 12/1970 | Kawada | |
| 3,634,807 A | 1/1972 | Grobe et al. | |
| 3,670,409 A | 6/1972 | Reimer | |
| 4,175,810 A | 11/1979 | Holt et al. | |
| 4,548,451 A | 10/1985 | Benarr et al. | |
| 4,657,336 A | 4/1987 | Johnson et al. | |
| 4,893,172 A | 1/1990 | Matsumoto et al. | |
| 4,998,885 A | 3/1991 | Beaman | |
| 5,135,403 A | 8/1992 | Rinaldi | |
| 5,148,266 A | 9/1992 | Khandros et al. | |
| 5,152,695 A | 10/1992 | Grabbe et al. | |
| 5,173,055 A | 12/1992 | Grabbe | |
| 5,199,879 A | 4/1993 | Kohn et al. | |
| 5,228,861 A | 7/1993 | Grabbe | |
| 5,257,950 A | 11/1993 | Lenker et al. | |
| 5,292,558 A | 3/1994 | Heller et al. | |
| 5,299,939 A | 4/1994 | Walker et al. | |
| 5,358,411 A | 10/1994 | Mroczkowski et al. | |
| 5,366,380 A | 11/1994 | Reymond | |
| 5,468,655 A | 11/1995 | Greer | |
| 5,483,741 A | 1/1996 | Akram et al. | |

(Continued)

FOREIGN PATENT DOCUMENTS

EP         0692823         1/1996

(Continued)

OTHER PUBLICATIONS

An article entitled "Patented Socketing System for the BGA/CSP Technology" by E-tec Interconnect Ltd., pp. 1-4.

(Continued)

*Primary Examiner*—Briggitte R. Hammond
(74) *Attorney, Agent, or Firm*—Hogue Intellectual Property, LLC

(57) ABSTRACT

A connector for electrically connecting to pads formed on a semiconductor device includes a substrate and an array of contact elements of conductive material formed on the substrate. Each contact element includes a base portion attached to the top surface of the substrate and a curved spring portion extending from the base portion and having a distal end projecting above the substrate. The curved spring portion is formed to curve away from a plane of contact and has a curvature disposed to provide a controlled wiping action when engaging a respective pad of the semiconductor device.

35 Claims, 19 Drawing Sheets

U.S. PATENT DOCUMENTS

| | | |
|---|---|---|
| 5,509,814 A | 4/1996 | Mosquera |
| 5,530,288 A | 6/1996 | Stone |
| 5,532,612 A | 7/1996 | Liang |
| 5,575,662 A | 11/1996 | Yamamoto et al. |
| 5,590,460 A | 1/1997 | DiStefano et al. |
| 5,593,903 A | 1/1997 | Beckenbaugh et al. |
| 5,629,837 A | 5/1997 | Barabi et al. |
| 5,632,631 A | 5/1997 | Fjelstad et al. |
| 5,751,556 A | 5/1998 | Butler et al. |
| 5,772,451 A | 6/1998 | Dozier et al. |
| 5,791,911 A | 8/1998 | Fasano et al. |
| 5,802,699 A | 9/1998 | Fjelstad et al. |
| 5,812,378 A | 9/1998 | Fjelstad et al. |
| 5,842,273 A | 12/1998 | Schar |
| 5,860,585 A | 1/1999 | Rutledge et al. |
| 5,896,038 A | 4/1999 | Budnaitis et al. |
| 5,934,914 A | 8/1999 | Fjelstad et al. |
| 5,967,797 A | 10/1999 | Maldonado |
| 5,980,335 A | 11/1999 | Barbieri et al. |
| 5,989,994 A | 11/1999 | Khoury et al. |
| 6,019,611 A | 2/2000 | McHugh et al. |
| 6,029,344 A | 2/2000 | Khandros et al. |
| 6,031,282 A | 2/2000 | Jones et al. |
| 6,032,356 A | 3/2000 | Eldridge et al. |
| 6,042,387 A | 3/2000 | Jonaidi |
| 6,063,640 A | 5/2000 | Mizukoshi et al. |
| 6,083,837 A | 7/2000 | Millet |
| 6,133,534 A | 10/2000 | Fukutomi et al. |
| 6,146,151 A | 11/2000 | Li |
| 6,156,484 A | 12/2000 | Bassous et al. |
| 6,184,699 B1 | 2/2001 | Smith et al. |
| 6,196,852 B1 | 3/2001 | Neumann et al. |
| 6,200,143 B1 | 3/2001 | Haba et al. |
| 6,204,065 B1 | 3/2001 | Ochiai |
| 6,205,660 B1 | 3/2001 | Fjelstad et al. |
| 6,208,157 B1 | 3/2001 | Akram et al. |
| 6,221,750 B1 | 4/2001 | Fjelstad |
| 6,224,392 B1 | 5/2001 | Fasano et al. |
| 6,250,933 B1 | 6/2001 | Khoury et al. |
| 6,255,727 B1 | 7/2001 | Khoury |
| 6,263,566 B1 | 7/2001 | Hembree et al. |
| 6,264,477 B1 | 7/2001 | Smith et al. |
| 6,293,806 B1 | 9/2001 | Yu |
| 6,293,808 B1 | 9/2001 | Ochiai |
| 6,297,164 B1 | 10/2001 | Khoury et al. |
| 6,298,552 B1 | 10/2001 | Li |
| 6,306,752 B1 | 10/2001 | DiStefano et al. |
| 6,335,210 B1 | 1/2002 | Farooq et al. |
| 6,336,269 B1 | 1/2002 | Eldridge et al. |
| 6,337,575 B1 | 1/2002 | Akram |
| 6,361,328 B1 | 3/2002 | Gosselin |
| 6,373,267 B1 | 4/2002 | Hiroi |
| 6,374,487 B1 | 4/2002 | Haba et al. |
| 6,392,524 B1 | 5/2002 | Biegelsen et al. |
| 6,392,534 B1 | 5/2002 | Flick |
| 6,397,460 B1 | 6/2002 | Hembree |
| 6,399,900 B1 | 6/2002 | Khoury et al. |
| 6,402,526 B1 | 6/2002 | Schreiber et al. |
| 6,409,521 B1 | 6/2002 | Rathburn |
| 6,420,661 B1 | 7/2002 | Di Stefano et al. |
| 6,420,789 B1 | 7/2002 | Tay et al. |
| 6,420,884 B1 | 7/2002 | Khoury et al. |
| 6,428,328 B2 | 8/2002 | Haba et al. |
| 6,436,802 B1 | 8/2002 | Khoury |
| 6,437,591 B1 | 8/2002 | Farnworth et al. |
| 6,442,039 B1 | 8/2002 | Schreiber |
| 6,452,407 B2 | 9/2002 | Khoury et al. |
| 6,461,892 B2 | 10/2002 | Beroz |
| 6,465,748 B2 | 10/2002 | Yamanashi et al. |
| 6,472,890 B2 | 10/2002 | Khoury et al. |
| 6,474,997 B1 | 11/2002 | Ochiai |
| 6,492,251 B1 | 12/2002 | Haba et al. |
| 6,517,362 B2 | 2/2003 | Hirai et al. |
| 6,520,778 B1 | 2/2003 | Eldridge et al. |
| 6,524,115 B1 | 2/2003 | Gates et al. |
| 6,551,112 B1 | 4/2003 | Li et al. |
| 6,576,485 B2 | 6/2003 | Zhou et al. |
| 6,604,950 B2 | 8/2003 | Maldonado et al. |
| 6,612,861 B2 | 9/2003 | Khoury et al. |
| 6,616,966 B2 | 9/2003 | Mathieu et al. |
| 6,622,380 B1 | 9/2003 | Grigg |
| 6,627,092 B2 | 9/2003 | Clements et al. |
| 6,640,432 B1 | 11/2003 | Mathieu et al. |
| 6,661,247 B2 | 12/2003 | Maruyama et al. |
| 6,664,131 B2 | 12/2003 | Jackson |
| 6,671,947 B2 | 1/2004 | Bohr |
| 6,677,245 B2 | 1/2004 | Zhou et al. |
| 6,692,263 B2 | 2/2004 | Villain et al. |
| 6,700,072 B2 | 3/2004 | DiStefano et al. |
| 6,701,612 B2 | 3/2004 | Khandros et al. |
| 6,719,569 B2 | 4/2004 | Ochiai |
| 6,730,134 B2 | 5/2004 | Neidich |
| 6,736,665 B2 | 5/2004 | Zhou et al. |
| 6,750,136 B2 | 6/2004 | Zhou et al. |
| 6,759,257 B2 | 7/2004 | McCormack et al. |
| 6,791,171 B2 | 9/2004 | Mok et al. |
| 6,814,584 B2 | 11/2004 | Zaderej |
| 6,814,587 B2 | 11/2004 | Ma |
| 6,815,961 B2 | 11/2004 | Mok et al. |
| 6,843,659 B2 | 1/2005 | Liao et al. |
| 6,847,101 B2 | 1/2005 | Fjelstad et al. |
| 6,848,173 B2 | 2/2005 | Fjelstad et al. |
| 6,848,929 B2 | 2/2005 | Ma |
| 6,853,210 B1 | 2/2005 | Farnworth et al. |
| 6,857,880 B2 | 2/2005 | Ohtsuki et al. |
| 6,881,070 B2 | 4/2005 | Chiang |
| 6,920,689 B2 | 7/2005 | Khandros et al. |
| 6,923,656 B2 | 8/2005 | Novotny et al. |
| 6,957,963 B2 | 10/2005 | Rathburn |
| 6,960,924 B2 | 11/2005 | Akram |
| 6,976,888 B2 | 12/2005 | Shirai |
| 6,980,017 B1 | 12/2005 | Farnworth et al. |
| 6,995,557 B2 | 2/2006 | Goldfine et al. |
| 7,002,362 B2 | 2/2006 | Farnworth et al. |
| 7,009,413 B1 | 3/2006 | Alghouli |
| 7,021,941 B1 | 4/2006 | Chuang |
| 2001/0001080 A1 | 5/2001 | Eldridge et al. |
| 2001/0024890 A1 | 9/2001 | Maruyama et al. |
| 2002/0011859 A1 | 1/2002 | Smith et al. |
| 2002/0055282 A1 | 5/2002 | Eldridge et al. |
| 2002/0058356 A1 | 5/2002 | Oya |
| 2002/0079120 A1 | 6/2002 | Eskildsen et al. |
| 2002/0117330 A1 | 8/2002 | Eldridge et al. |
| 2002/0129894 A1 | 9/2002 | Liu et al. |
| 2002/0133941 A1 | 9/2002 | Akram et al. |
| 2002/0146919 A1 | 10/2002 | Cohn |
| 2002/0178331 A1 | 11/2002 | Beardsley et al. |
| 2002/0179331 A1 | 12/2002 | Brodsky et al. |
| 2003/0000739 A1 | 1/2003 | Frustchy et al. |
| 2003/0003779 A1 | 1/2003 | Rathburn |
| 2003/0022503 A1 | 1/2003 | Clements et al. |
| 2003/0035277 A1 | 2/2003 | Saputro et al. |
| 2003/0049951 A1 | 3/2003 | Eldridge et al. |
| 2003/0089936 A1 | 5/2003 | McCormack et al. |
| 2003/0096512 A1 | 5/2003 | Cornell |
| 2003/0099097 A1 | 5/2003 | Mok et al. |
| 2003/0129866 A1 | 7/2003 | Romano et al. |
| 2003/0147197 A1 | 8/2003 | Uriu et al. |
| 2003/0194832 A1 | 10/2003 | Lopala et al. |
| 2004/0118603 A1 | 6/2004 | Chambers |
| 2004/0127073 A1 | 7/2004 | Ochiai |
| 2005/0088193 A1 | 4/2005 | Haga |
| 2005/0099193 A1 | 5/2005 | Burgess |
| 2005/0142900 A1 | 6/2005 | Boggs et al. |

| | | | |
|---|---|---|---|
| 2005/0167816 A1 | 8/2005 | Khandros et al. | |
| 2005/0287828 A1 | 12/2005 | Stone et al. | |
| 2006/0028222 A1 | 2/2006 | Farnworth et al. | |

FOREIGN PATENT DOCUMENTS

| | | |
|---|---|---|
| EP | 0692823 A1 | 1/1996 |
| EP | 1 005 086 | 5/2000 |
| EP | 1 280 241 | 1/2003 |
| EP | 1208241 | 1/2003 |
| EP | 0839321 | 1/2006 |
| JP | 200011443 | 4/2000 |
| JP | 2000011443 | 4/2000 |
| JP | 2001203435 | 7/2001 |
| WO | 9602068 | 1/1996 |
| WO | WO9602068 | 1/1996 |
| WO | 9744859 | 11/1997 |
| WO | WO-199743653 A1 | 11/1997 |
| WO | 0213253 | 2/2002 |
| WO | WO-2005034296 A1 | 4/2005 |
| WO | WO-2005036940 A1 | 4/2005 |
| WO | WO-2005067361 A1 | 7/2005 |

OTHER PUBLICATIONS

Gary B. Kromann et al., "Motorola's PowerPC 603 and PowerPC 604 RISC Microprocessor: the C4/Ceramic-ball-grid Array Interconnect Technology", Motorola Advanced Packaging Technology, Motorola, Inc., 1996, pp. 1-10.

Ravi Mahajan et al., "Emerging Directions for Packaging Technologies", Intel Technology Journal, V. 6, Issue 02, May 16, 2002, pp. 62-75.

International Search Report and Written Opinion, Oct. 18, 2005.

European Search Report.

Guerin, luc, et al., "Spring Land Grid Array Development: An Integrated Demountable Solution", www.chips.ibm.com/news, MicroNews Third Quarter 2001,(2001),3.

6A

CONNECTOR FOR MAKING ELECTRICAL CONTACT AT SEMICONDUCTOR SCALES

CROSS-REFERENCE TO RELATED APPLICATIONS

This application is related to concurrently filed and commonly assigned U.S. patent application Ser. No. 10/731,213, entitled "Method for Forming MEMS Grid Array Connector," of Dirk D. Brown et al. The aforementioned patent application is incorporated herein by reference in its entirety.

FIELD OF THE INVENTION

The invention relates to reconnectable, remountable electrical connectors, and, in particular, to an electrical connector for connecting to semiconductor scale devices.

DESCRIPTION OF THE RELATED ART

Electrical interconnects or connectors are used to connect two or more electronic components together or to connect an electronic component to a piece of electrical equipment, such as a computer, router, or tester. For instance, an electrical interconnect is used to connect an electronic component, such as an integrated circuit (an IC or a chip), to a printed circuit broad. An electrical interconnect is also used during integrated circuit manufacturing for connecting an IC device under test to a test system. In some applications, the electrical interconnect or connector provides separable or remountable connection so that the electronic component attached thereto can be removed and reattached. For example, it may be desirable to mount a packaged microprocessor chip to a personal computer mother board using a separable interconnect device so that malfunctioning chips can be readily removed or upgraded chips can be readily installed.

There are also applications where an electrical connector is used to make direct electrical connection to metal pads formed on a silicon wafer. Such an electrical connector is often referred to as a "probe" or "probe card" and is typically used during the testing of the wafer during the manufacturing process. The probe card, typically mounted on a tester, provides electrical connection from the tester to the silicon wafer so that individual integrated circuits formed on the wafer can be tested for functionality and compliance with specific parametric limits.

Conventional electrical connectors are usually made of stamped metal springs, which are formed and then individually inserted into an insulating carrier to form an array of electrical connection elements. Other approaches to making electrical connectors include using isotropically conductive adhesives, injection molded conductive adhesives, bundled wire conductive elements, springs formed by wirebonding techniques, and small solid pieces of metal.

Land grid array (LGA) refers to an array of metal pads (also called lands) that are used as the electrical contact points for an integrated circuit package, a printed circuit board, or other electronic component. The metal pads are usually formed using thin film deposition techniques and coated with gold to provide a non-oxidizing surface. Ball Grid array (BGA) refers to an array of solder balls or solder bumps that are used as the electrical contact points for an integrated circuit package. Both LGA and BGA packages are widely used in the semiconductor industry and each has its associated advantages or disadvantages. For instance, LGA packages are typically cheaper to manufacture than ball grid array (BGA) packages because there is no need to form solder balls or solder bumps. However, LGA packages are typically more difficult to assemble onto a PC board or a multi-chip module. An LGA connector is usually used to provide removable and remountable socketing capability for LGA packages connected to PC boards or to chip modules.

Advances in semiconductor technologies has led to shrinking dimensions within semiconductor integrated circuits and particularly, decreasing pitch for the contact points on a silicon die or a semiconductor package. The pitch, that is, the spacing between each electrical contact point (also referred to as a "lead") on a semiconductor device is decreasing dramatically in certain applications. For example, contact pads on a semiconductor wafer can have a pitch of 250 micron or less. At the 250-micron pitch level, it is prohibitively difficult and very expensive to use conventional techniques to make separable electrical connections to these semiconductor devices. The problem is becoming even more critical as the pitch of contact pads on a semiconductor device decreases below 50 microns and simultaneous connection to multiple contact pads in an array is required.

When making electrical connections to contact pads, such as metal pads on a silicon wafer or on a land grid array package, it is important to have a wiping action or a piercing action when the contact elements engage the pads in order to break through any oxide, organic material, or other films that may be present on the surface of the metal pads and that might otherwise inhibit the electrical connection. FIG. 1 illustrates a contact element being applied to engage a metal pad on a substrate. Referring to FIG. 1, a connector 10 includes a contact element 12 for making electrical connection to a metal pad 16 on a substrate 14. Connector 10 can be a wafer probe card and contact element 12 is then a probe tip for engaging pad 16 on silicon substrate 14. Under normal processing and storage conditions, a film 18, which can be an oxide film or an organic film, forms on the surface of metal pad 16. When contact element 12 engages metal pad 16, contact element must pierce through film 18 in order to make a reliable electrical connection to metal pad 16. The piercing of film 18 can be resulted from a wiping action or a piercing action of contact element 12 when the contact element engages the metal pad.

While it is necessary to provide a wiping or piercing action, it is important to have a well-controlled wiping or piercing action that is strong enough to penetrate the surface film but soft enough to avoid damaging the metal pad when electrical contact is made. Furthermore, it is important that any wiping action provides a sufficient wiping distance so that enough of the metal surface is exposed for satisfactory electrical connection.

Similarly, when making contacts to solder balls, such as solder balls formed on a BGA package, a chip-scale package, or a wafer-level package, it is important to provide a wiping or piercing action to break through the native oxide layer on the solder balls in order to make good electrical contact to the solder balls. However, when conventional approaches are used to make electrical contact to solder balls, the solder balls may be damaged or completely dislodged from the package. FIG. 2A illustrates a contact element being applied to contact a solder ball. When contact element 12 contacts solder ball 22 formed on a substrate 20 such as for testing, contact element 12 applies a piercing action which often result in the formation of a crater on the top surface (also called the base surface) of the solder ball. When substrate 20 including solder ball 22 is subsequently attached to another semiconductor device, such as a PC board or a chip-scale package, the crater in solder ball 22 can lead to void formation at the solder ball interface. FIGS. 2B and 2C illustrate the result of attaching solder ball 22 to a metal pad 26 of a substrate 24. After solder reflow (FIG. 2C), solder ball 22 is attached to metal pad 26. However, a void is formed at the solder ball interface due to the presence of the crater on the top surface of solder ball 22 which crater was created by the piercing action of contact element 12. The presence of such a void can affect the electrical characteristics of the connection and more importantly, degrades the reliability of the connection.

Therefore, it is desirable to provide an electrical contact element that can be provide a controlled wiping action on a metal pad, particularly for pads with a pitch of less than 50 microns. It is also desirable that the wiping action provides a wiping distance of up to 50% of the contact pad. Furthermore, when electrical contact to solder balls are made, it is desirable to have an electrical contact element that can provide a controlled wiping action on the solder ball without damaging the contact surface of the solder ball.

Another problem encountered by electrical connectors is the variation in coplanarity and positional misalignment of the contact points of a semiconductor device to be connected. For instance, variations in the fabrication process for semiconductor wafers and packages often lead to variations in the final position, in each planar dimension, of the contact points (metal pads or solder balls). In an array of contact points, positional misalignment leads to variations in the relative positions of different contact points. Thus, a connector must be capable of accommodating positional variations due to misalignment in order to be useful in most applications. Hence, it is desirable to have a scalable electrical contact element that can behave elastically so that normal variations in coplanarity and positional misalignment of the contact points can be tolerated.

Connectors or interconnect systems for making electrical connection to semiconductor devices are known. For example, U.S. Pat. No. 6,032,356, issued to Eldridge et al. on Mar. 7, 2000, discloses an array of resilient contact structures that are mounted directly on the bonding pads of a semiconductor wafer. The contact structures are formed by attaching gold bond wires to the wafer, shaping the bond wires and then overcoating the bond wires to form composite contact elements. Although Eldridge discloses a approach for providing an array of all-metal contacts at semiconductor scales, the contact elements requires an expensive serial manufacturing process where the contact elements are formed one at a time. Also, the inherent pointy shape of the contact structures results in piercing action which is prone to damaging the contact point such as a solder ball when making contact.

U.S. Pat. No. 6,184,065, issued to Smith et al. on Feb. 6, 2001, discloses small metal springs created by the inherent stress gradient in a thin metal film. Smith's approach provides an array of all-metal contacts at semiconductor scales. However, the metal springs point into the surface of the plane to be contacted and therefore is prone to damaging the solder balls when used to probe solder balls.

U.S. Pat. No. 6,250,933, issued to Khoury et al. on Jun. 26, 2001, discloses a contact structure in which the contactors are produced on a semiconductor substrate or other dielectric by microfabrication technology and in which each of the contactors is shaped like a bridge, with one or more angled portions supporting a horizontal contacting portion. Khoury's approach provides an array of all-metal contacts at semiconductor scales but provides a limited amount of wiping action when interfacing with metal pads because the contacting component is parallel to the metal pad. Khoury addresses the lack of wiping problem by adding asperities and making asymmetric structures to induce a wiping action. However, it will be obvious to one skilled in the art that such approaches can provide a wiping distance of only 10% or less of the overall dimension of the contact which is often not enough for a satisfactory electrical connection. In addition, when contacting solder ball arrays, Khoury's approach requires the base surface of the solder balls to be physically contacted since the contacting surface is parallel to the solder ball array. Such contact can lead to damage on the base surface of the solder ball which in turn can lead to void formation during subsequent solder reflow as shown in FIG. 2C.

In summary, the conventional connectors are not satisfactory for use with small pitch size semiconductor devices. The conventional connects are also not satisfactory for providing wiping/piercing action without damaging the contact points such as the base surface of a solder ball.

SUMMARY OF THE INVENTION

According to one embodiment of the present invention, a connector for electrically connecting to pads formed on a semiconductor device includes a substrate and an array of contact elements of conductive material formed on the substrate. Each contact element includes a base portion attached to the top surface of the substrate and a curved spring portion extending from the base portion and having a distal end projecting above the substrate. The curved spring portion is formed to curve away from a plane of contact and has a curvature disposed to provide a controlled wiping action when engaging a respective pad of the semiconductor device.

According to another aspect of the present invention, a method for forming a connector including an array of contact elements includes providing a substrate, forming a support layer on the substrate, patterning the support layer to define an array of support elements, isotropically etching the array of support elements to form rounded corners on the top of each support element, forming a metal layer on the substrate and on the array of support elements, and patterning the metal layer to define an array of contact elements where each contact element includes a first metal portion on the substrate and a second metal portion extending from the first metal portion and partially across the top of a respective support element. The method further includes removing the array of support elements. The array of contact elements thus formed each includes a base portion attached to the substrate and a curved spring portion extending from the base portion and having a distal end projecting above the substrate. The curved spring portion is formed to have a concave curvature with respect to the surface of the substrate.

According to another aspect of the present invention, a method for forming a connector including an array of contact elements includes providing a substrate, providing a conductive adhesion layer on the substrate, forming a support layer on the conductive adhesion layer, patterning the support layer to define an array support elements, isotropically etching the array of support elements to form rounded corners on the top of each support element, forming a metal layer on the conductive adhesion layer and on the array of support elements, patterning the metal layer and the conductive adhesion layer to define an array of contact elements. Each contact element includes a first metal portion formed on a conductive adhesion portion and a second metal portion extending from the first metal portion and partially across the top of a respective support element. The method further includes removing the array of support elements.

The array of contact elements thus formed each includes a base portion attached to the conductive adhesion portion which is attached to the substrate and a curved spring portion extending from the base portion and having a distal end projecting above the substrate. The curved spring portion is formed to have a concave curvature with respect to the surface of the substrate.

The present invention is better understood upon consideration of the detailed description below and the accompanying drawings.

BRIEF DESCRIPTION OF THE DRAWINGS

FIGS. 6A and 6B illustrate connectors according to alternate embodiments of the present invention.

DETAILED DESCRIPTION OF THE PREFERRED EMBODIMENTS

Figure 1:
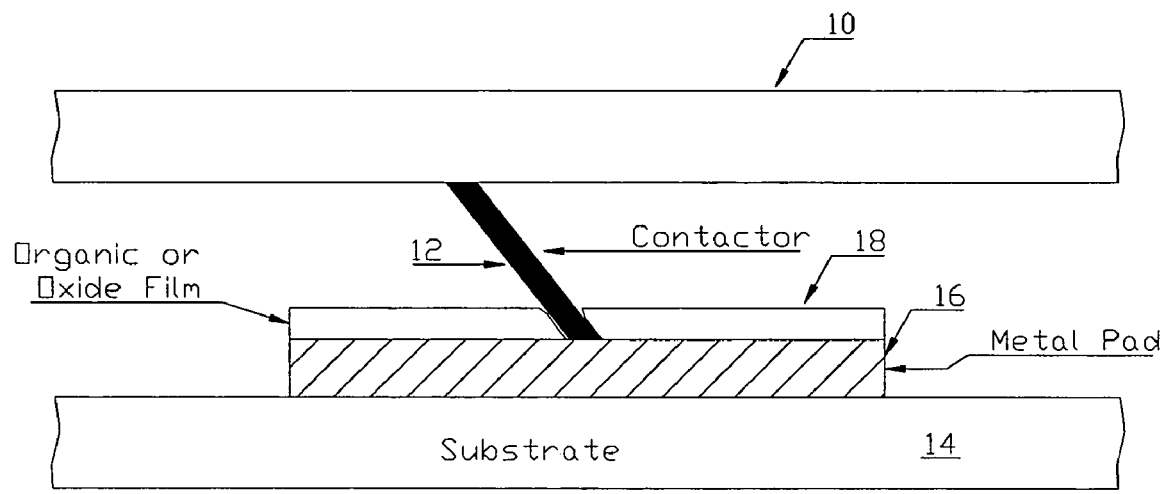
FIG. 1 illustrates a contact element being applied to engage a metal pad on a substrate.
Figure 2A:
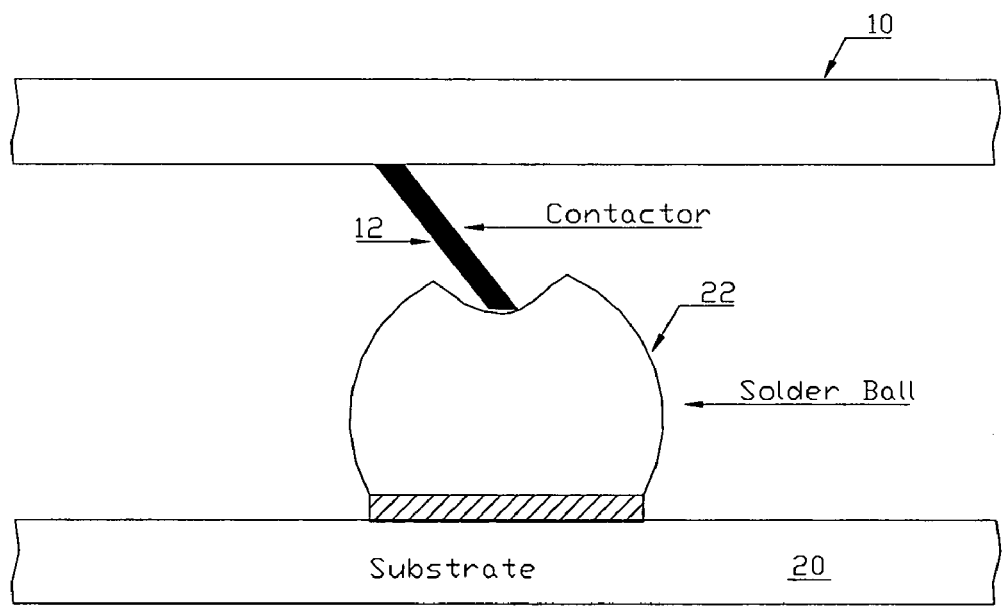
FIG. 2A illustrates a contact element being applied to contact a solder ball.
Figure 2B:
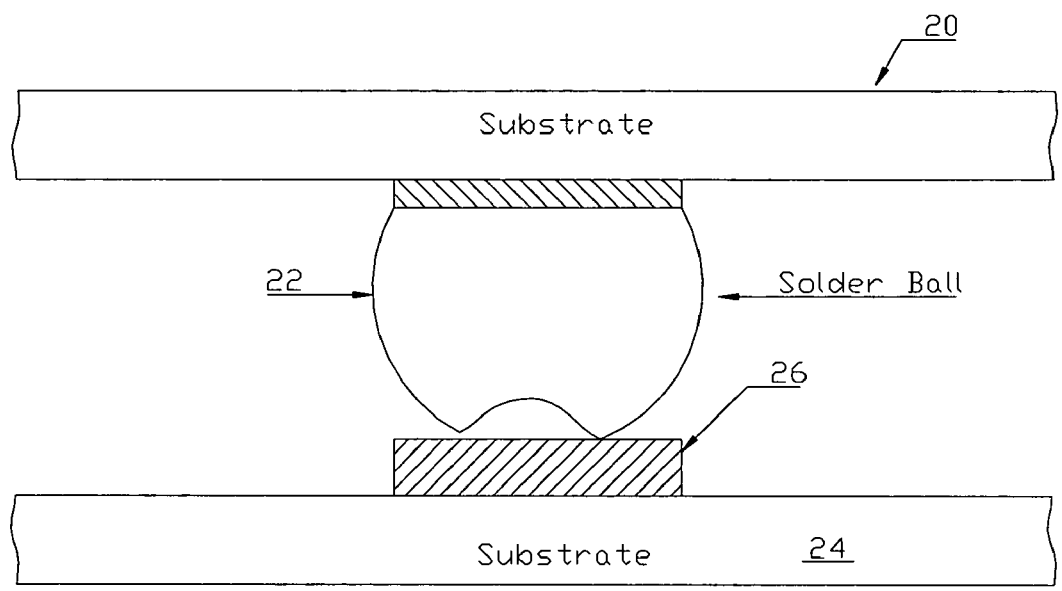
FIGS. 2B and 2C illustrate the result of attaching a damaged solder ball to a metal pad of a substrate.
Figure 2C:
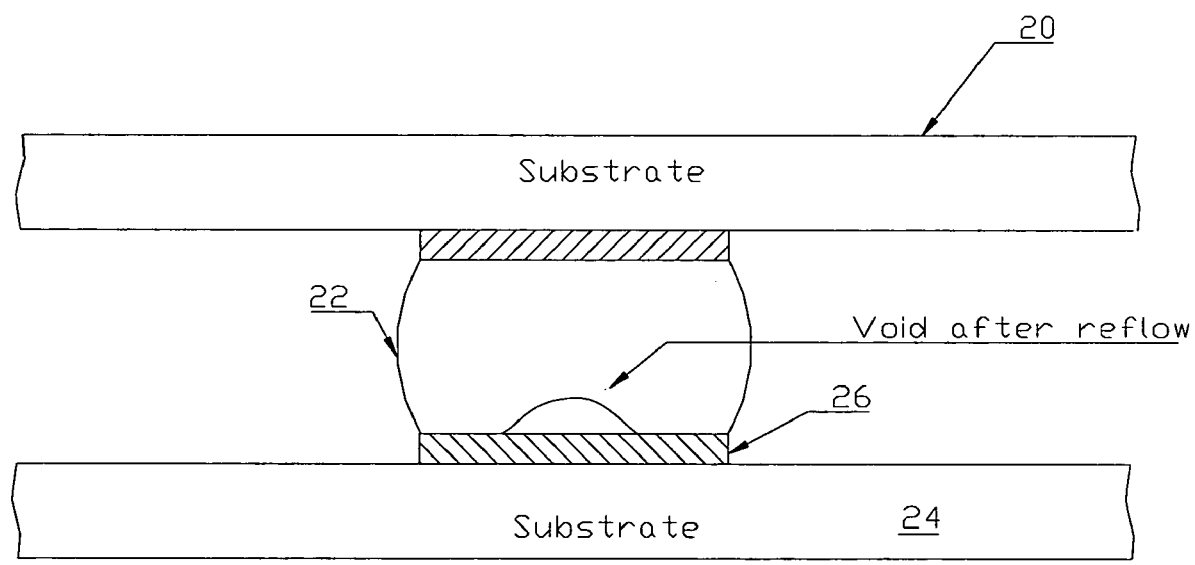

In accordance with the principles of the present invention, a connector for providing separable and remountable connection to a device includes an array of contact elements formed on a substrate where each contact element includes a curved spring portion formed to curve away from a plane of contact and having a curvature disposed to provide a controlled wiping action when engaging a contact point of the device. The connector of the present invention can be used to make electrical connection to devices at semiconductor scales, such as a silicon wafer or a packaged integrated circuit. The contact elements can be formed to make electrical connection to contact points having a pitch of 250 micron or less and in particular, the contact elements of the present invention enable electrical connection to contact points having a pitch of 50 micron or less. By providing a controlled wiping action, the connector of the present invention can be used to connect to a variety of contact surfaces without damaging the contact surface. Finally, the contact elements in the connector of the present invention have a large elastic working range approximately equal to or greater than the electrical path length, thereby allowing the contact elements to operate over a large range of compressions often required in normal operating conditions.

The connector of the present invention provides numerous advantages over conventional connector systems. First, the connector of the present invention includes contact elements having a curved spring portion that curved away from the plane of contact, that is, the surface of the contact points to be contacted. Thus, the contact elements can provide a soft controlled wiping action when engaging a metal pad or a solder ball, allowing effective electrical connection to be made without damaging the contact surface. Furthermore, the contact elements in the connector of the present invention can achieve an optimal wiping distance with optimal contact force. Conventional connectors often include curved spring members that curved into the plane of contact. Such curvature results in a piercing action when the spring members are engaged with a contact pad and often results in undesirable damages to the pad. Alternately, in other conventional connectors, the contact element either provides no wiping action or insufficient wiping distance. The connector of the present invention overcomes many of the disadvantages of the conventional connectors.

Second, the connector of the present invention provides scalable, low profile, low insertion force, high density, and separable/reconnectable electrical connection and is particularly suited for use in high speed and high performance applications. The connector can be built at relatively low cost while exhibiting highly reliable and compliant operating characteristics. In particular, the connector of the present invention can be scaled to contact metal pads on a wafer or lands of a LGA package where the pads or lands are separated by a pitch of 50 microns or less. The connector of the present invention can also be scaled to contact solder balls of a BGA package or solder balls formed on a wafer where the solder balls are separated by a pitch of 250 micron or less.

Third, the connector of the present invention can be used to engage pads of semiconductor device which pads are in vertical alignment with the contact elements of the connection. Thus, only the application of a vertical external biasing force is needed to connect the connector to the device to be connected. This is in contrary to many conventional connector systems which require the application of a lateral force to engage a connector and often result in damage to the connection points.

The connector of the present invention can be used to make electrical connection to a wide variety of devices. For example, the connector of the present invention can be used to make electrical connection to metal pads on a silicon wafer, to a ball grid array (BGA) package, to a land grid array package, to a wafer-level package, to a chip scale package and other semiconductor or electrical device. In the present description, the term "device" is used to refer to the class of electronic devices or component to which electrical connection or interconnection is necessary. Thus, a semiconductor device can include but is not limited to a semiconductor wafer, a packaged or unpackaged integrated circuit (IC), a ball grid array formed on a semiconductor wafer or as an IC package, a land grid array formed on a semiconductor wafer, on a chip module or on an IC package.

Figure 3A:
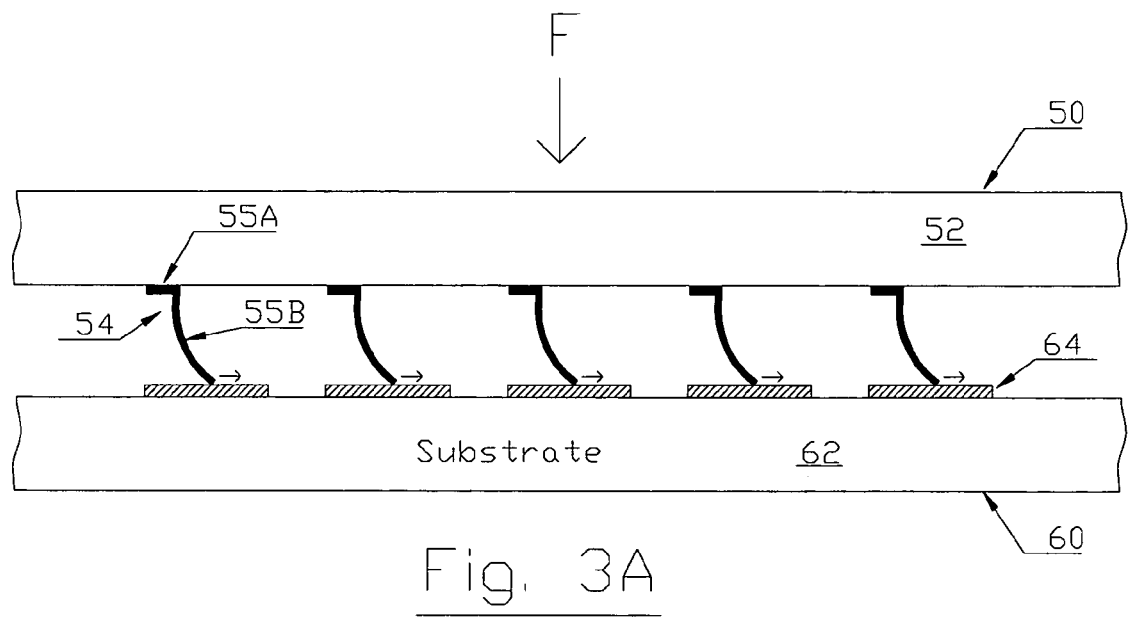
FIGS. 3A and 3B are cross-sectional view of a connector according to one embodiment of the present invention.
Figure 3B:
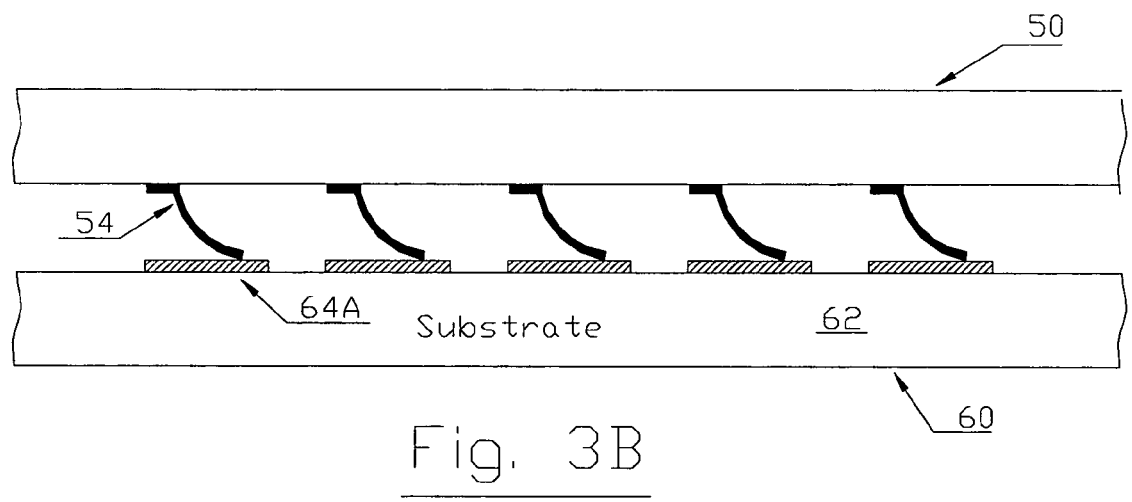

FIGS. 3A and 3B are cross-sectional view of a connector according to one embodiment of the present invention. FIGS. 3A and 3B illustrate a connector 50 of the present invention being connected to a semiconductor device 60 including metal pads 64, formed on a substrate 62, as contact points. Semiconductor device 60 can be a silicon wafer where metal pads 64 are the metal bonding pads formed on the wafer. Semiconductor device 60 can also be a LGA package where metal pads 64 represent the "lands" or metal connection pads formed on the LGA package. The coupling of connector 50 to semiconductor device 60 in FIGS. 3A and 3B is illustrative only and is not intended to limit the application of connector 50 to connecting with wafers or LGA packages only.

Referring to FIG. 3A, connector 50 includes an array of contact elements 54 formed on a substrate 52. Substrate 52 can be formed as a dielectric material or a semiconductor material. Because connector 50 can be built be for connecting to semiconductor devices at semiconductor scales, connector 50 is usually formed using material that are commonly used in semiconductor fabrication processes. In one embodiment, substrate 52 is made of quartz, silicon or a ceramic wafer and contact elements 54 are formed on a dielectric layer which dielectric layer could be a SOS, SOG, BPTEOS, or TEOS layer formed on the top surface of the substrate. The array of contact elements is typically formed as a two-dimensional array arranged to mate with corresponding contact points on a semiconductor device to be contacted. In one embodiment, connector 50 is formed to contact metal pads having a pitch of 50 microns or less.

Contact elements 54 are formed using a conductive material. Each contact element 54 includes a base portion 55A attached to the top surface of substrate 52 and a curved spring portion 55B extending from base portion 55A. Curved spring portion 55B has a proximal end contiguous with base portion 55A and a distal end projecting above substrate 52. Note that FIGS. 3A and 3B illustrate connector 50 being turned upside down to engage semiconductor device 60. The use of directional terms such as "above" and "top surface" in the present description is intended to describe the positional relationship of the elements of the connector as if the connector is positioned with the contact elements facing upward. One of ordinary skill in the art would appreciate that the directional terms used herein are illustrative only and intended only to describe the relative position of different parts of the contact element.

Referring still to FIG. 3A, contact element 54 includes curved spring portion that is formed to curve away from a plane of contact. In the present description, the "plane of contact" refers to the surface of the contact point to which the contact element is to be contacted. In the present illustration, the plane of contact is the surface of metal pad 64. As shown in FIG. 3A, curved spring portion 55B is formed to have a concave curvature with respect to the surface of substrate 52. Thus, curved spring portion 55B curves away from the surface of metal pad 64. Curved spring portion 55B of contact element 54 has a curvature that is disposed to provide a controlled wiping action when engaging a respective metal pad 64 of the semiconductor device to be contacted.

In operation, an external biasing force, denoted F in FIG. 3A, is applied to connector 50 causing connector 50 to be compressed against metal pads 64 of semiconductor device 60. The curved spring portion of a contact element 54 engages the respective metal pad in a controlled wiping action so that each contact element makes effective electrical connection to the respective pad. The curvature of contact elements 54 ensures that the optimal contact force is achieved concurrently with the optimal wiping distance. The wiping distance is the amount of travel the distal end of the contact element makes on the surface of the metal pad when contacting the metal pad. In general, the contact force can be on the order of 5 to 100 grams depending on the application and the wiping distance can be on the order of 5 to 400 microns.

Another feature of the contact element of the present invention is that the curved spring portion of the contact element enables a very large elastic working range. Specifically, because the curved spring portion can move in both the vertical and the horizontal directions, an elastic working range on the order of the electrical path length of the contact element can be achieved. In the present description, the "electrical path length" of the contact element is defined as the distance the electrical current has to travel from the distal end of the curved spring portion to the base portion of the contact element. Basically, the contact elements of the connector of the present invention have an elastic working range that spans the entire length of the contact elements.

Contact elements 54 are formed using a conductive metal that can also provide the desired elasticity. In one embodiment, contact elements 54 are formed using titanium (Ti) as a support structure that can later be plated to obtain desired elastic behavior. In other embodiments, contact elements 54 are formed using a copper-alloy (Cu-alloy) or a multilayer metal sheet such as stainless steel coated with Copper-Nickel-Gold (Cu/Ni/Au) multilayer metal sheet. In a preferred embodiment, the contact elements are formed using a small-grained copper-beryllium (CuBe) alloy and then plated with electroless Nickel-Gold (Ni/Au) to provide a non-oxidizing surface. Furthermore, in an alternate embodiment, contact elements 54 are formed using different metals for the base portions and the curved spring portions.

In the embodiment shown in FIG. 3A, contact element 54 is shown as formed by a rectangular shaped based portion with one curved spring portion. This configuration is illustrative only and is not intended to be limiting. The contact element of the present invention can be formed in a variety of configurations and each contact element only needs to have a base portion sufficient for attaching the curved spring portion to the substrate. The base portion can assume any shape and can be formed as a circle or other useful shape for attaching the contact element to the substrate. Furthermore, a contact element can include multiple curved spring portions extended from the base portion as will be discussed in more detail below.

Figure 4A:
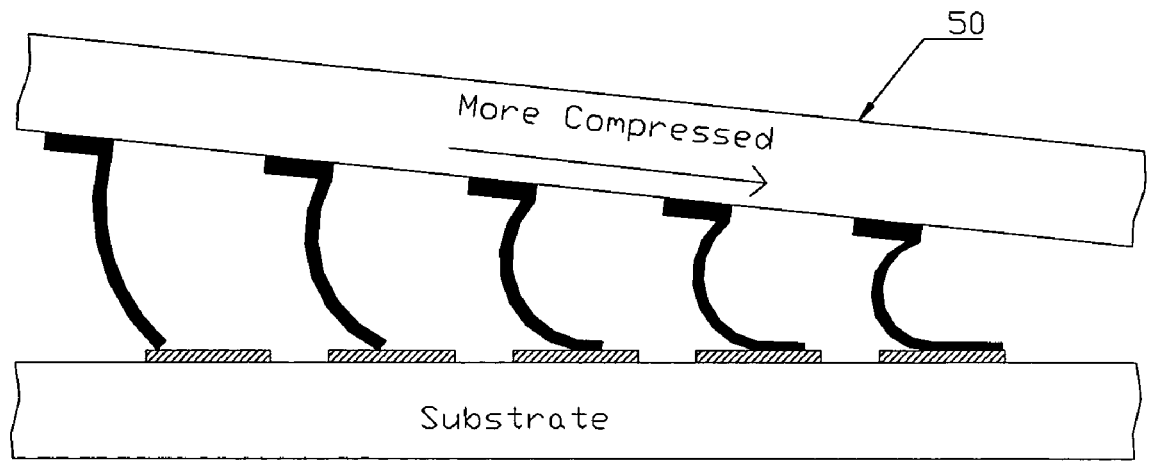
FIGS. 4A and 4B are cross-sectional diagrams illustrating the use of the connector of FIG. 3A for engaging different semiconductor devices.
Figure 4B:
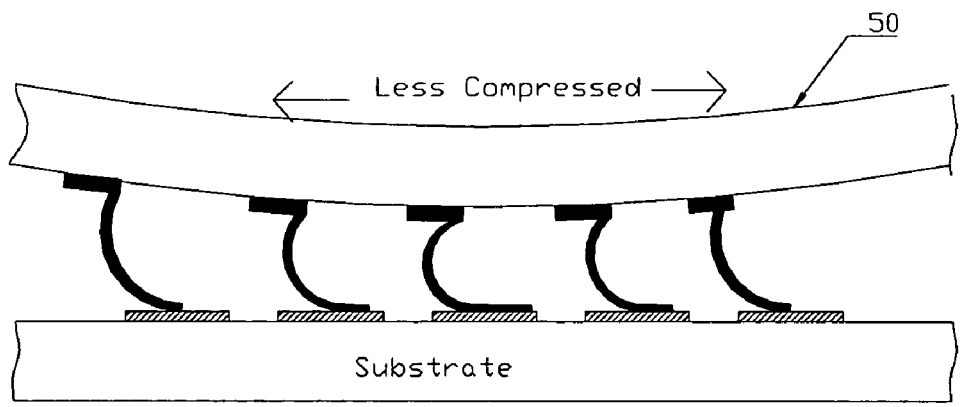

The large elastic working range of the connector of the present invention enables the connector to accommodate normal coplanarity variations and positional misalignments in the semiconductor devices to be connected. The connector is thus capable of providing reliable electrical connection despite coplanarity and positional irregularities that may exist in semiconductor devices to be connected. FIGS. 4A and 4B are cross-sectional diagrams illustrating the use of connector 50 for engaging different semiconductor devices.

In FIG. 4A, positional variations of the metal pads to be contacted require contact elements at one end of connector 50 to be more compressed than contact elements at the opposite end. In FIG. 4B, coplanarity variations of the metal pads to be contacted require contact elements in the middle portion of connector 50 to be more compressed than contact elements at the two ends of connector 50. Because the contact elements of the present invention have a large elastic working range, different contact elements can be compressed at different levels while providing effective electrical connection over all contact elements.

Figure 5A:
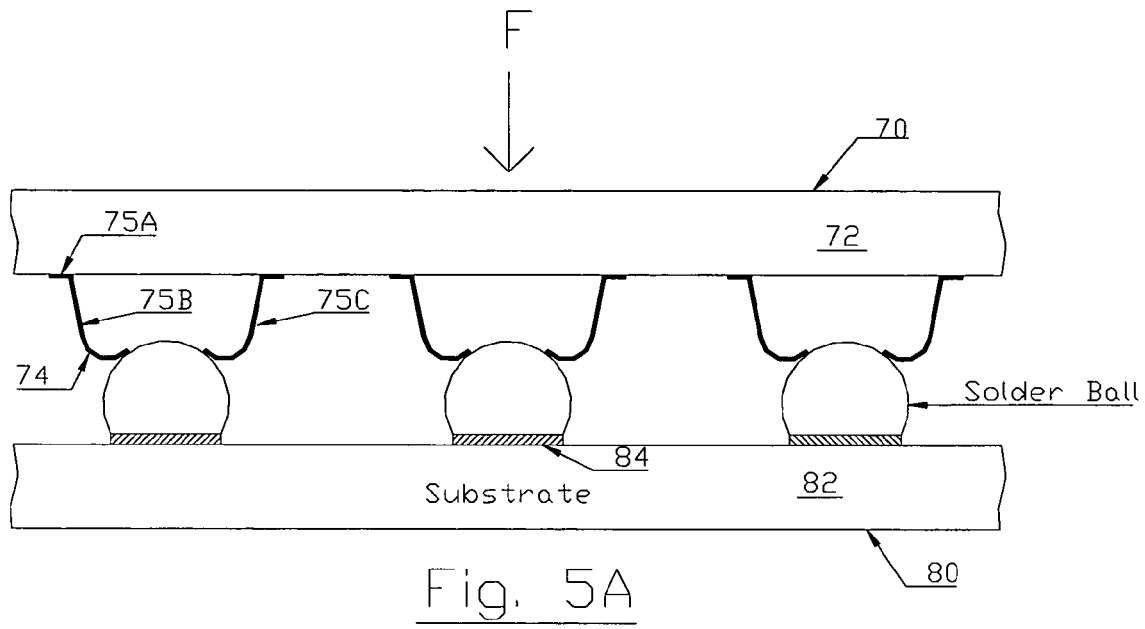
FIGS. 5A and 5B illustrate a connector according to an alternate embodiment of the present invention.
Figure 5B:
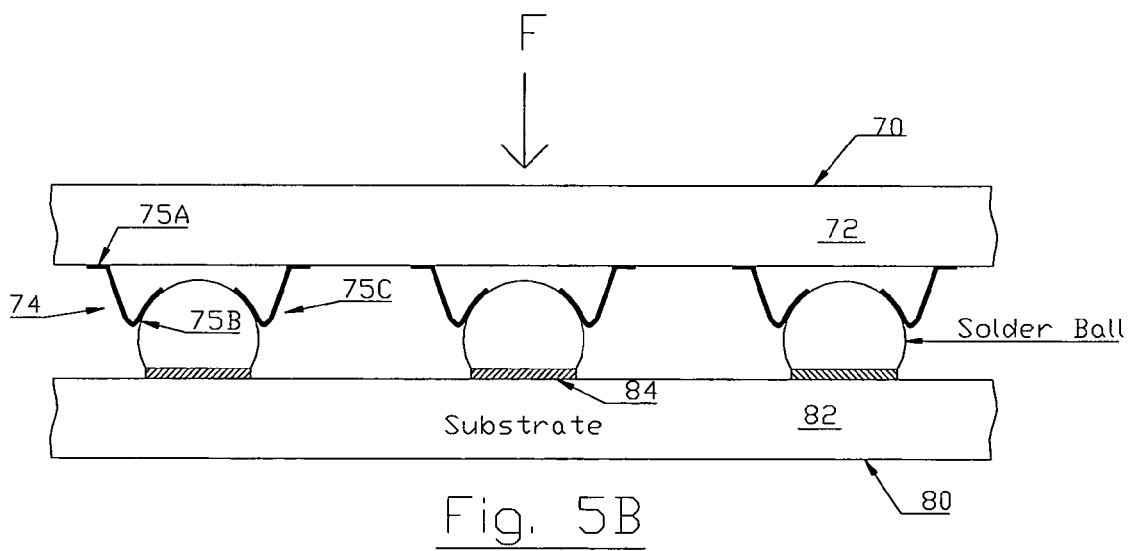

FIGS. 5A and 5B illustrate a connector according to an alternate embodiment of the present invention. Referring to FIG. 5A, a connector 70 includes an array of contact elements 74 formed on substrate 72. In the present embodiment, each contact element 74 includes a base portion 75A and two curved spring portions 75B and 75C extending from base portion 75A. Curved spring portion 75B and 75C have distal ends projecting above substrate 72 and facing towards each other. Other characteristics of curved spring portions 75B and 75C are the same as curved spring portion 55B. That is, curved spring portions 75B and 75C are formed curved away from a plane of contact and each has a curvature disposed to provide a controlled wiping action when engaging a contact point of a semiconductor device to be contacted. Furthermore, curved spring portions 75B and 75C have an elastic working range approximately equal to the electrical path length of the contact element, thus enabling a large range of compression to be applied.

In the present illustration, connector 70 is used to contact a semiconductor device 80, such as a BGA package, including an array of solder balls 84 as contact points. FIG. 5B illustrates connector 70 being fully engaged with semiconductor device 80. Connector 70 can be used to contact metal pads such as pads on a land grid array package. However, using of connector 70 to contact solder balls 84 provides particular advantages.

First, contact elements 74 contact the respective solder balls along the side of the solder balls. No contact to the base surface of the solder ball is made. Thus, contact elements 74 do not damage the base surface of the solder balls during contact and effectively elimination the possibility of void formation when the solder balls are subsequently reflowed for permanently attachment.

Second, because each curved spring portion of contact elements 74 is formed to curved away from the plane of contact which in the present case is a plane tangent to the side surface of the solder ball being contacted, the contact elements 74 provides a controlled wiping action when making contact with the respective solder balls. In this manner, effective electrical connection can be made without damaging the contact surface, that is, the surface of the solder balls.

Third, connector 70 is scalable and can be used to contact solder balls having a pitch of 250 microns or less.

Lastly, because each contact element has a large elastic working range on the order of the electrical path length, the contact elements can accommodate a large range of compression. Therefore, the connector of the present invention can be used effectively to contact conventional devices having normal coplanarity variations or positional misalignments.

Figure 6B:
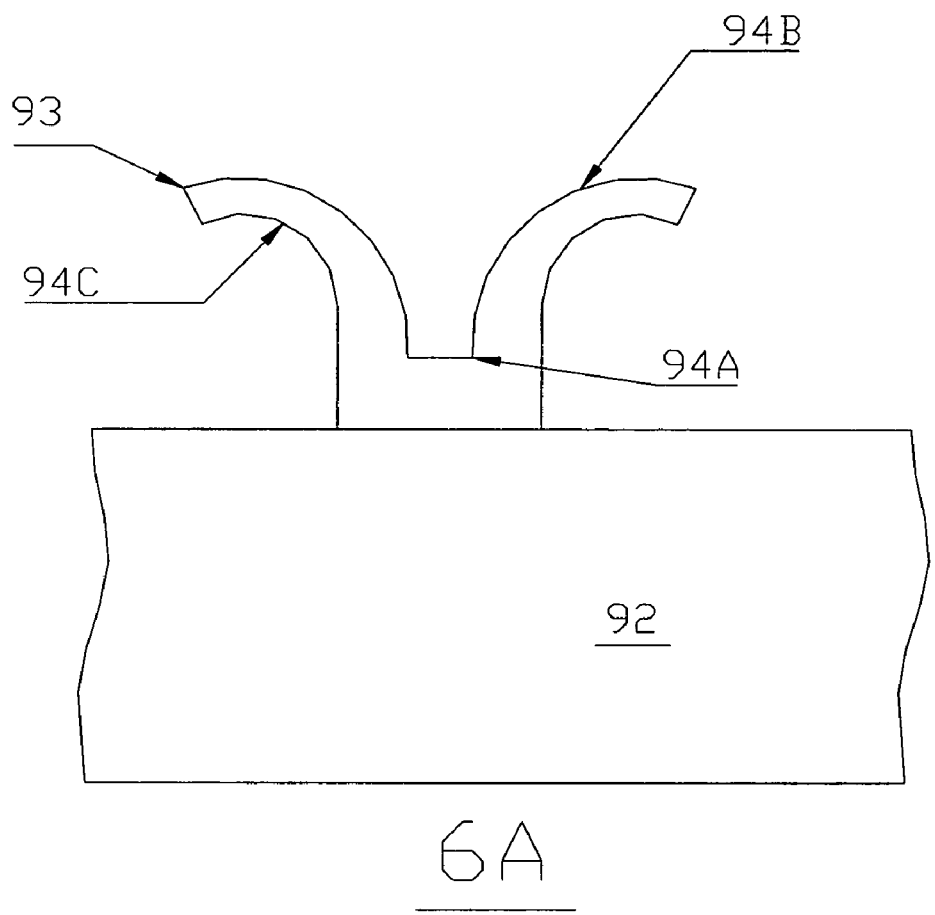
Figure 6B:
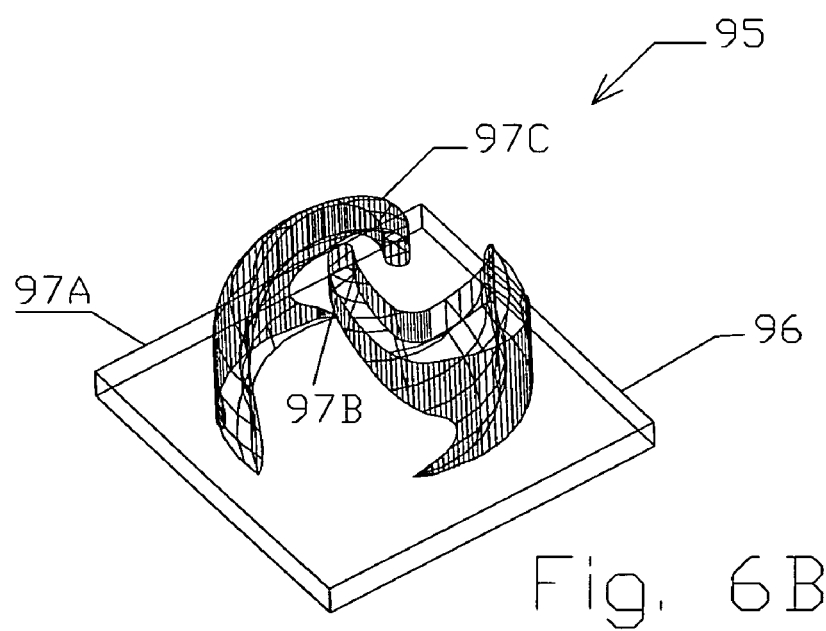

Connectors 50 and 70 in FIGS. 3A and 5A are shown as including a curved spring portion that projects linearly from the base portion. The embodiments shown in FIGS. 3A and 5A are illustrative only and are not intended to be limited. The connector of the present invention can be configured in a variety manner depending on the types of contact points to be contacted and depending on the desired contact force. FIGS. 6A and 6B illustrate connectors according to alternate embodiments of the present invention. Referring to FIG. 6A, a connector 90 includes a contact element 93 formed on a substrate 92. Contact element 93 includes a base portion 94A and a first curved spring portion 94B and a second curved spring portion 94C. First curved spring portion 94B and second curved spring portion 94C have distal ends that point away from each other. Contact element 93 can be used to engage a contact point including a metal pad or a solder ball. When used to engage a solder ball, contact element 93 cradles the solder ball between the first and second curved spring portions. Thus, first and second curved spring portions 94B and 94C contact the side surface of the solder ball in a controlled wiping motion in a direction that curved away from the plane of contact of the solder ball.

FIG. 6B illustrates a contact element 95 formed on a substrate 96. Contact element 95 includes a base portion 97A and a first curved spring portion 97B and a second curved spring portion 97C extended from the base portion. In the present embodiment, first curved spring portion 97B and the second curved spring portion 97C project above substrate 96 in a spiral configuration. Contact element 95 can be used to contact a metal pad or a solder ball. In both cases, first and second curved spring portion 97B and 97C curve away from the plane of contact and provide a controlled wiping action.

The connectors of the present invention can be manufactured in a variety of processes using different processing sequence. For example, the curved spring portion of each contact element can be formed by stamping. In one embodiment, the connectors of the present invention are formed using semiconductor processing techniques. When formed using semiconductor processing techniques, the connectors of the present invention can be referred to as being built as MicroElectroMechanical Systems (MEMS). Thus, in one embodiment of the present invention, the connector of the present invention is also referred to as a MEMS grid array connector.

Figure 7A:
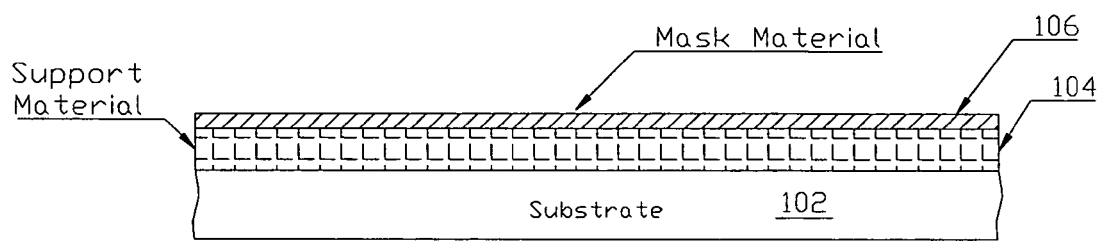
FIGS. 7A to 7H illustrate the processing steps for forming the connector of FIG. 3A according to one embodiment of the present invention.
Figure 7B:
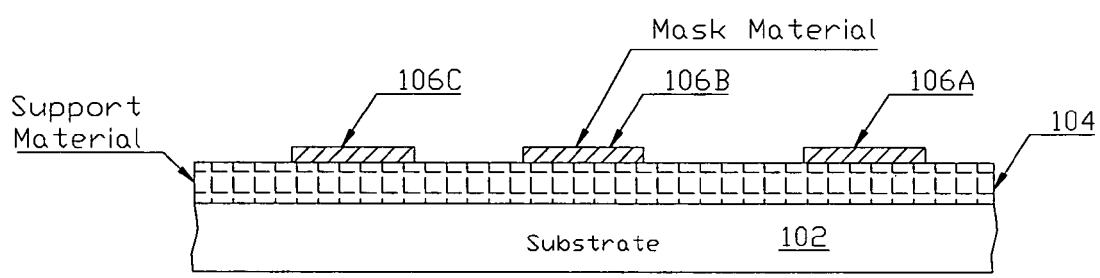

FIGS. 7A to 7H illustrate the processing steps for forming connector 50 of FIG. 3A according to one embodiment of the present invention. Referring to FIG. 7A, a substrate 102 on which the contact elements are to be formed is provided. Substrate 102 can be a silicon wafer or ceramic wafer for example and may include a dielectric layer formed thereon (not shown in FIG. 7A). As described above, a dielectric layer of SOS, SOG, BPTEOS, or TEOS layer can be formed on substrate 102 for isolating the contact elements from substrate 102. Then, a support layer 104 is formed on substrate 102. Support layer 104 can be a deposited dielectric layer, such as an oxide or nitride layer, a spin-on dielectric, a polymer, or any other suitable etchable material. In one embodiment, support layer 104 is deposited by a chemical vapor deposition (CVD) process. In another embodiment, support layer 104 is deposited by a plasma vapor deposition (PVD) process. In yet another embodiment, support layer 104 is deposited by a spin-on process. In yet another embodiment, when substrate 102 is not covered by a dielectric layer or a conductive adhesive layer, the support layer can be grown using an oxidation process commonly used in semiconductor manufacturing.

After the support layer 104 is deposited, a mask layer 106 is formed on the top surface of support layer 104. Mask layer 106 is used in conjunction with a conventional lithography process to define a pattern on support layer 104 using mask layer 106. After the mask layer is printed and developed (FIG. 7B), a mask pattern, including regions 106A to 106C, is formed on the surface of support layer 104 defining areas of support layer 104 to be protected from subsequent etching.

Figure 7C:
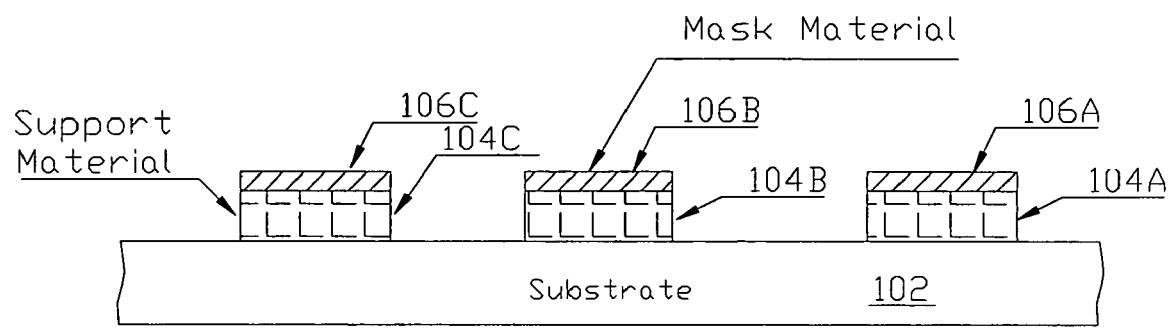
Figure 7D:
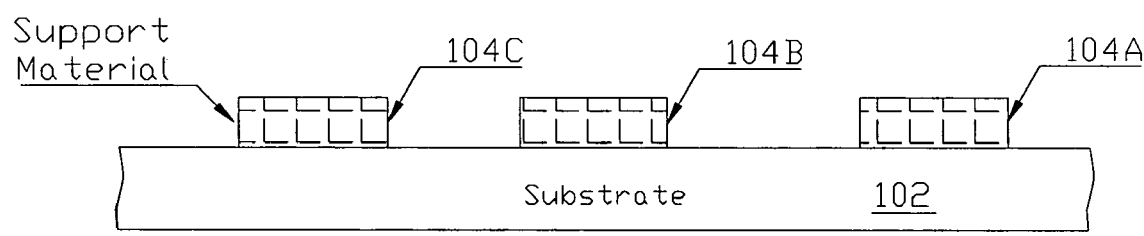

Referring to FIG. 7C, an anisotropic etching process is performed using regions 106A to 106C as a mask. As a result of the anisotropic etching process, support layer 104 not covered by a patterned mask layer is removed. Accordingly, support regions 104A to 104C are formed. The mask pattern including regions 106A to 106C is subsequently removed to expose the support regions (FIG. 7D).

Figure 7E:
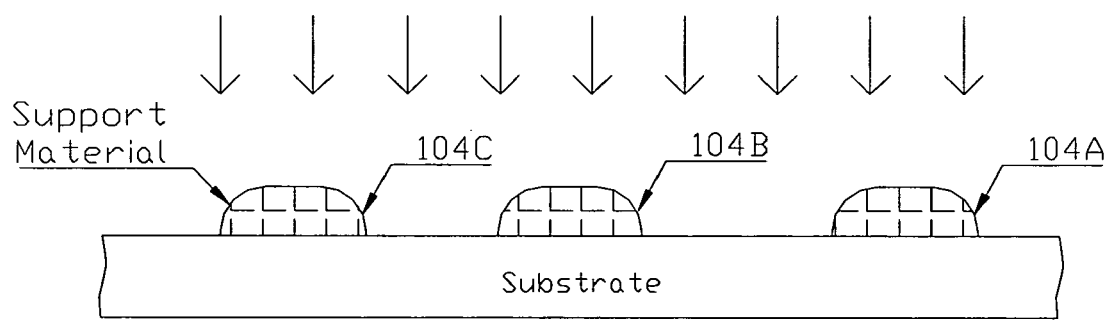

Referring to 7E, support regions 104A to 104C are then subjected to an isotropic etching process. An isotropic etching process remove material under etch in the vertical and horizontal directions at substantially the same etch rate. Thus, as a result of the isotropic etching, the top corners of support regions 104A to 104C are rounded off as shown in FIG. 7E. In one embodiment, the isotropic etching process is a plasma etching process using $SF_6$, $CHF_3$, $CF_4$ or other well known chemistries commonly used for etching dielectric materials. In an alternate embodiment, the isotropic etching process is a wet etch process, such as a wet etch process using a buffered oxide etch (BOE).

Figure 7F:
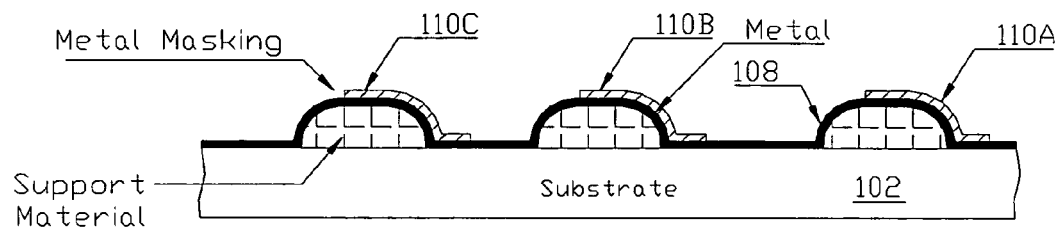

Then, referring to FIG. 7F, a metal layer 108 is formed on the surface of substrate 102 and the surface of support regions 104A to 104C. Metal layer 108 can be a copper layer or a copper-alloy (Cu-alloy) layer or a multilayer metal deposition such as Tungsten coated with Copper-Nickel-Gold (Cu/Ni/Au). In a preferred embodiment, the contact elements are formed using a small-grained copper-beryllium (CuBe) alloy and then plated with electroless Nickel-Gold (Ni/Au) to provide a non-oxidizing surface. Metal layer 108 can be deposited by a CVD process, by electro plating, by sputtering, by physical vapor deposition (PVD) or using other conventional metal film deposition techniques. A mask layer is deposited and patterned into mask regions 110A to 110C using a conventional lithography process. Mask regions 110A to 110C define areas of metal layer 108 to be protected from subsequent etching.

Figure 7G:
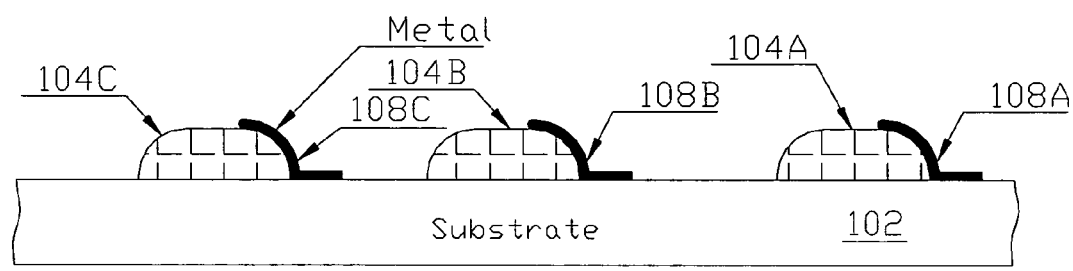
Figure 7H:
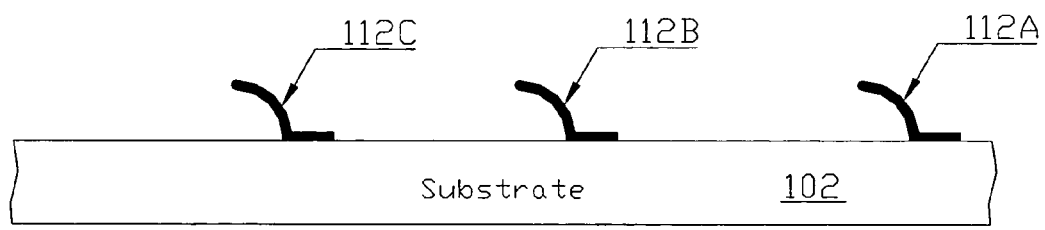

Then, the structure in FIG. 7F is subjected to an etching process for removing metal layer not covered by mask regions 110A to 110C. As a result, metal portions 108A to 108C are formed as shown in FIG. 7G. Each of metal portions 108A to 108C includes a base portion formed on substrate 102 and a curved spring portion formed on a respective support region (104A to 104C). Accordingly, the curved spring portion of each metal portion assumes the shape of the underlying support region, projecting above the substrate surface and having a curvature that provides a wiping action when applied to contact a contact point.

To complete the connector, support regions 104A to 104C are removed (FIG. 7H), such as by using a wet etch or an anisotropic plasma etch or other etch process. If the support layer is formed using an oxide layer, a buffered oxide etchant can be used to remove the support regions. As a result, free standing contact elements 112A to 112C are formed on substrate 102.

One of ordinary skill in the art, upon being apprised of the present invention, would appreciate that many variations in the above processing steps are possible to fabricate the connector of the present invention. For example, the chemistry and etch condition of the isotropic etching process can be tailored to provide a desired shape in the support regions so that the contact elements thus formed have a desired curvature. Furthermore, one of ordinary skill in the art would appreciate that through the use of semiconductor processing techniques, a connector can be fabrication with contact elements having a variety of properties. For example, a first group of contact elements can be formed with a first pitch while a second group of contact elements can be formed with a second pitch greater or smaller than the first pitch. Other variations in the electrical and mechanical properties of the contact element are possible, as will be described in more detail below.

FIGS. 8A to 8H illustrate the processing steps for forming connector 70 of FIG. 5A according to one embodiment of the present invention. The processing steps shown in FIGS. 8A to 8H are substantially the same as the processing steps shown in FIGS. 7A to 7H. However, FIGS. 8A to 8H illustrate that different configuration of contact elements can be fabricated by using suitably designed mask patterns.

Figure 8A:
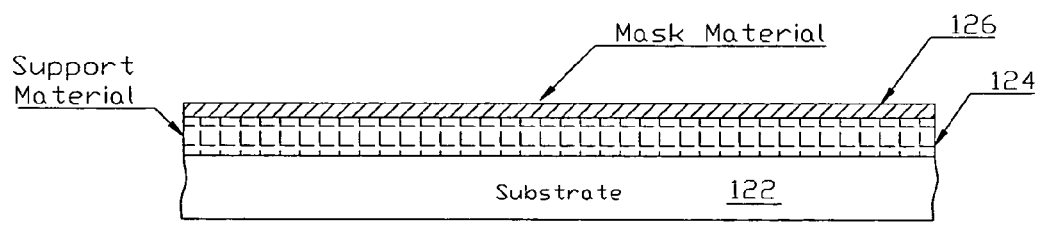
FIGS. 8A to 8H illustrate the processing steps for forming the connector of FIG. 5A according to one embodiment of the present invention.
Figure 8B:
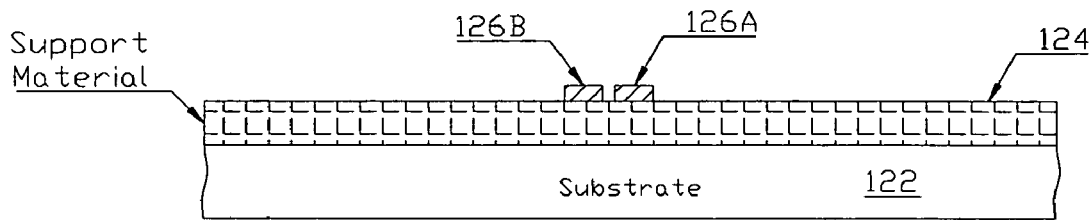

Referring to FIG. 8A, a support layer 124 is formed on a substrate 122. A mask layer 126 is formed on the support layer for defining mask regions for forming the connector of FIG. 5A. In the present embodiment, mask regions 126A and 126B (FIG. 8B) are positioned closed together to allow a contact element including two curved spring portion to be formed.

Figure 8C:
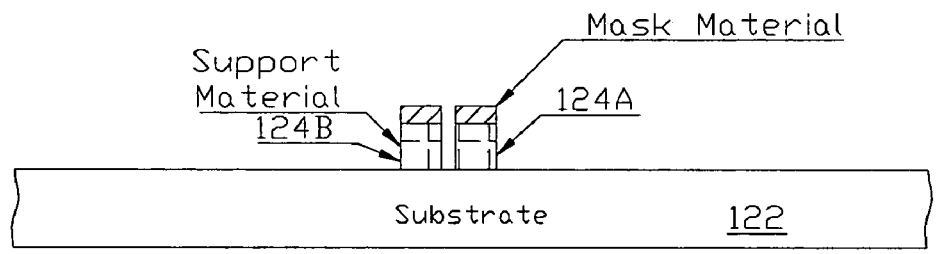
Figure 8D:
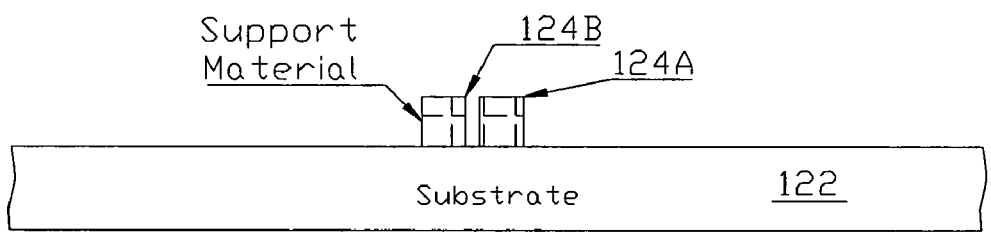
Figure 8E:
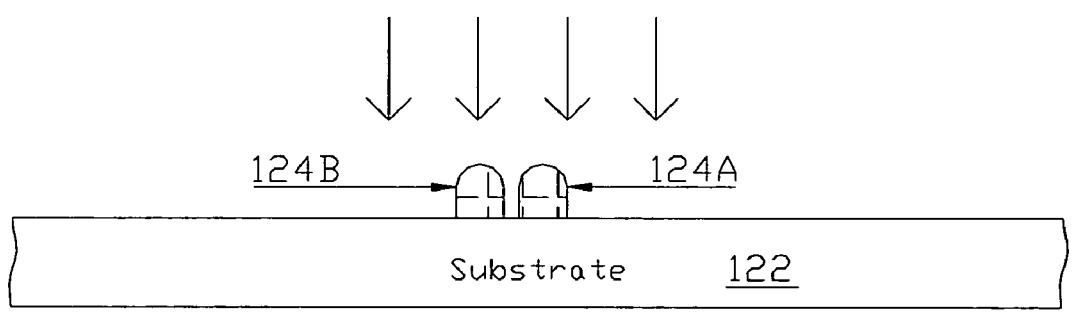

After an isotropic etching process is performed using mask regions 126A and 126B as mask, support regions 124A and 124B are formed (FIG. 8C). The mask regions are removed to expose the support regions (FIG. 8D). Then, support regions 124A and 124B are subjected to an isotropic etching process to shape the structures so that the top surface of the support regions includes rounded corners (FIG. 8E).

Figure 8F:
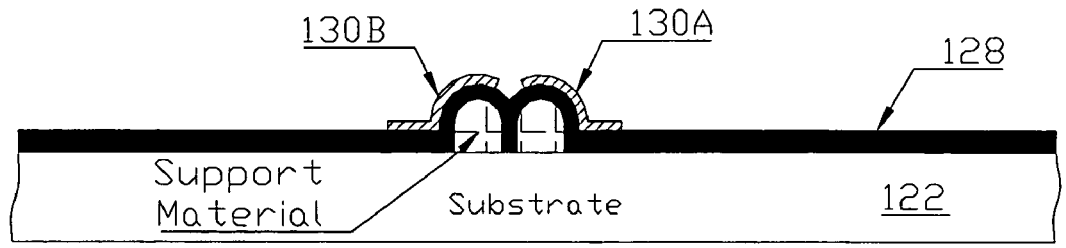
Figure 8G:
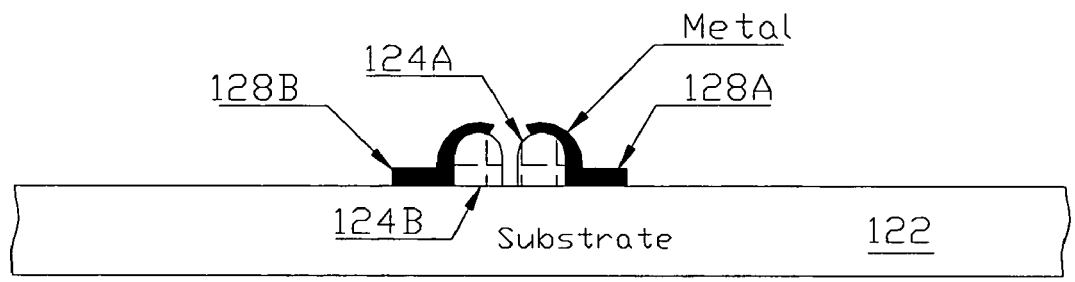
Figure 8H:
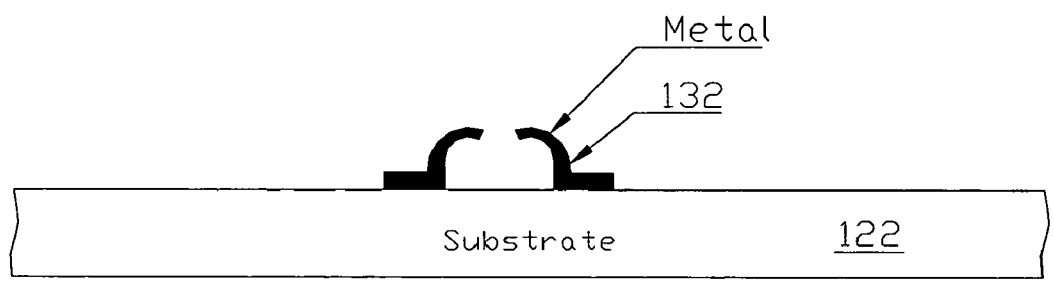

A metal layer 128 is deposited over the surface of substrate 122 and over the top surface of support regions 124A and 124B (FIG. 8F). A mask pattern, including regions 130A and 130B, is defined on metal layer 128. After metal layer 128 is etched using mask regions 130A and 130B as mask, metal portions 128A and 128B are formed (FIG. 8G). Each of metal portions 128A and 128B includes a base portion formed on substrate 122 and a curved spring portion formed on the respective support region (124A or 124B). The curved spring portion of each metal portion assumes the shape of the underlying support region, projecting above the substrate surface and having a curvature that provides a wiping action when applied to contact a contact point. In the present embodiment, the distal ends of metal portions 128A and 128B are formed facing each other. To complete the connector, support regions 124A to 124B are removed (FIG. 8H). As a result, a free standing contact element 132 is formed on substrate 102. In the cross-sectional view of FIG. 8H, the two metal portions of contact element 132 appears to unconnected. However, in actual implementation, the base portions of the metal portions are connected such as by forming a ring around the contact element or the base portions can be connected through conductive layers formed in substrate 122.

Figure 9A:
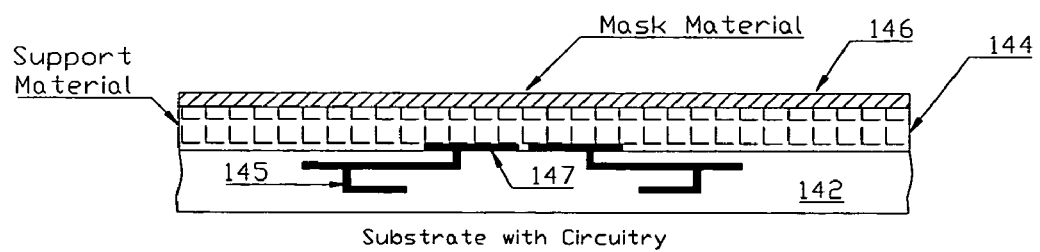
FIGS. 9A to 9H illustrate the processing steps for forming the connector of FIG. 5A according to an alternate embodiment of the present invention.
Figure 9B:
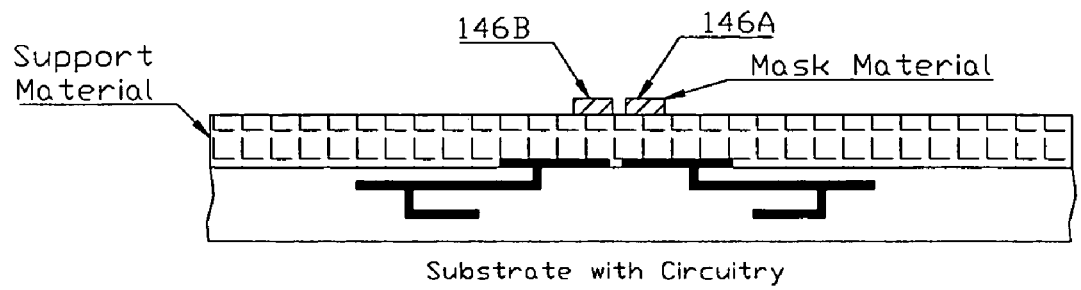

FIGS. 9A to 9H illustrate the processing steps for forming connector 70 of FIG. 5A according to an alternate embodiment of the present invention. Referring to FIG. 9A, a substrate 142 including predefined circuitry 145 is provided. Predefined circuitry 145 can include interconnected metal layers or other electrical devices, such as capacitors or inductors, which are typically formed in substrate 142. In the present embodiment, a top metal portion 147 is formed on the top surface of substrate 142 to be connected to the contact element to be formed. To form the desired contact element, a support layer 144 and a mask layer 146 are formed on the top surface of substrate 142.

Figure 9C:
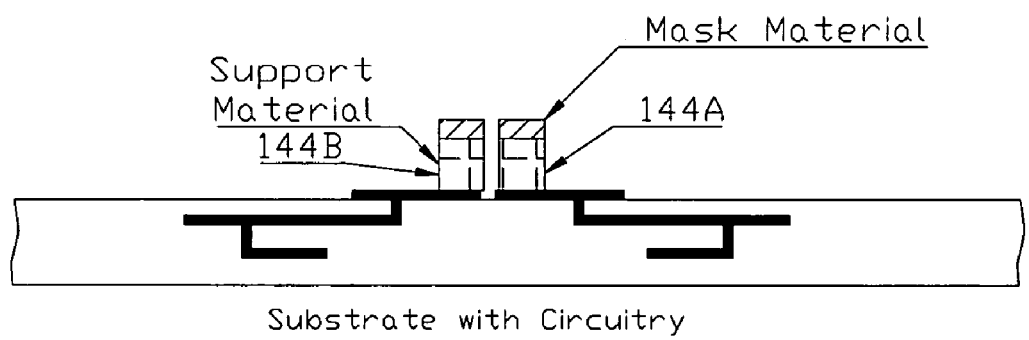
Figure 9D:
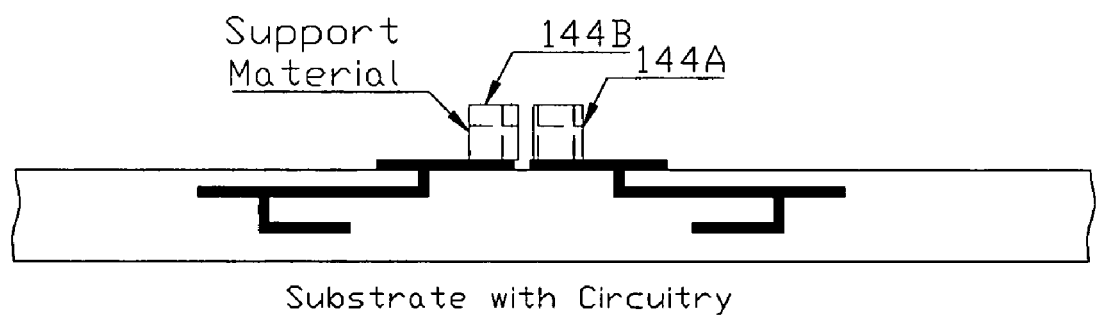
Figure 9E:
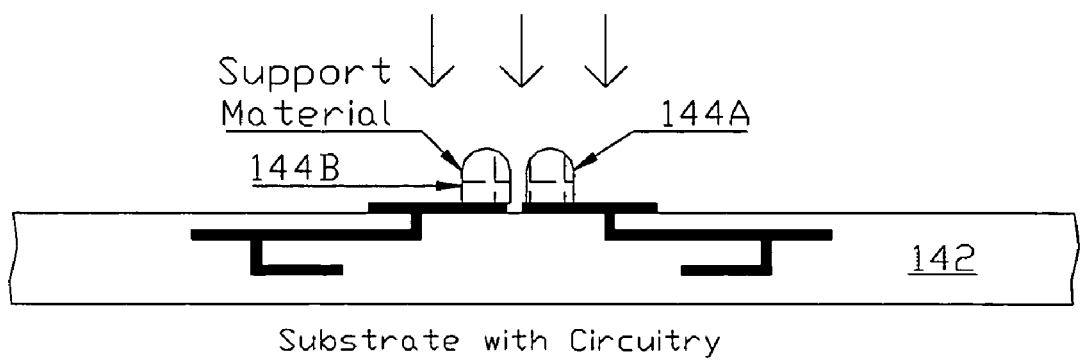
Figure 9F:
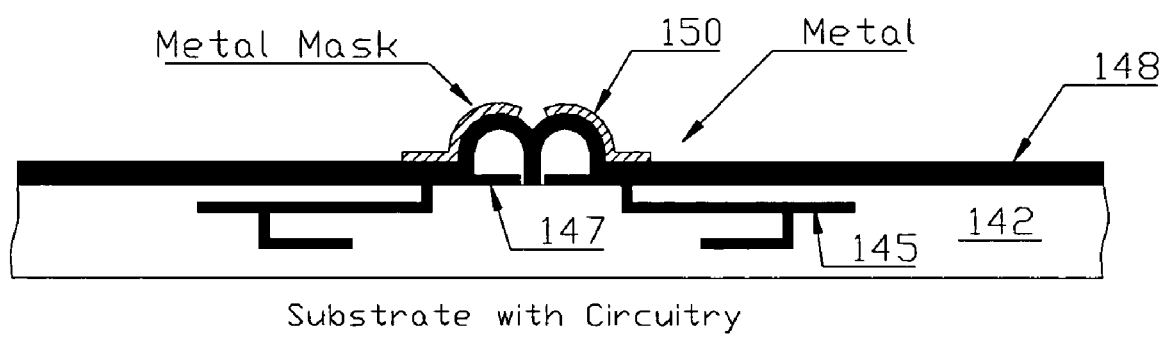
Figure 9G:
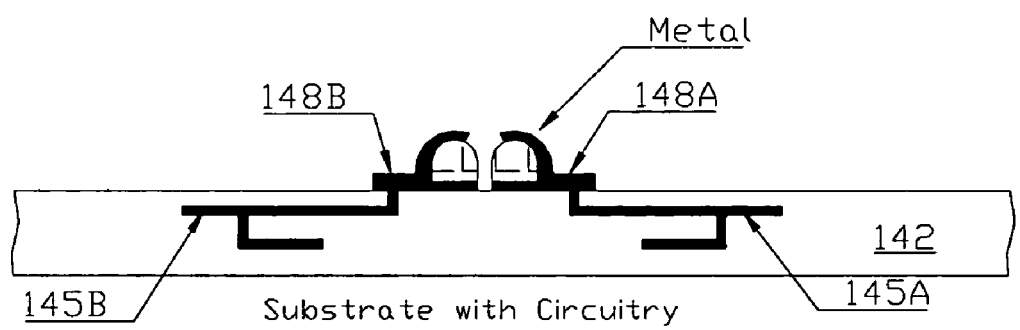

The processing steps proceed in a similar manner as described above with reference to FIGS. 8A to 8H. Mask layer 146 is patterned (FIG. 9B) and support layer 144 is etched accordingly to formed support regions 144A and 144B (FIG. 9C). The mask regions are removed to expose the support regions (FIG. 9D). Then, an isotropic etching process is carried out the round out the top corners of support regions 144A and 144B (FIG. 9E). A metal layer 148 is deposited on the surface of substrate 142 and over the support regions (FIG. 9F). Metal layer 148 is formed over top metal portion 147. As a result, metal layer 148 is eclectically connected to circuit 145.

Figure 9H:
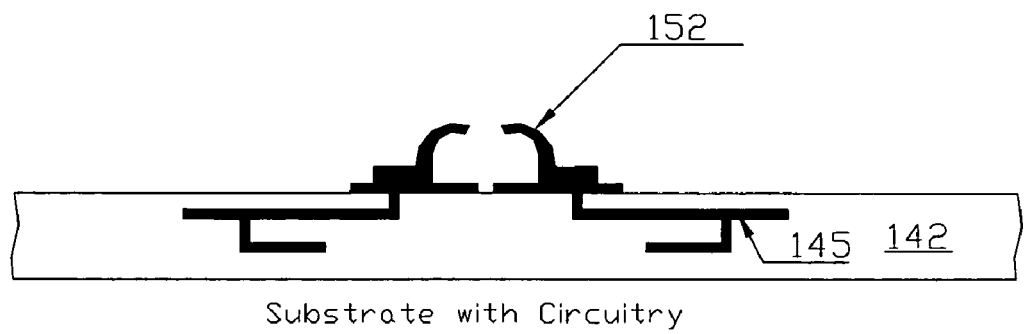

Metal layer 148 is patterned by a mask layer 150 (FIG. 9F) and subjected to an etching process. Metal portions 148A and 148B are thus formed (FIG. 9G) having distal ends pointing towards each other. Support portions 144A and 144B are removed to complete the fabrication of contact element 152 (FIG. 9H).

As thus formed, contact element 152 is electrically connected to circuit 145. In the manner, additional functionality can be provided by the connector of the present invention. For example, circuit 145 can be formed to electrically connect certain contact elements together. Circuit 145 can also be used to connect certain contact elements to electrical devices such as a capacitor or an inductor formed in or on substrate 142.

Fabricating contact element 152 as part of an integrated circuit manufacturing process provides further advantage. Specifically, a continuous electrical path is formed between contact element 152 and the underlying circuit 145. There is no metal discontinuity or impedance mismatch between the contact element and the associated circuit. In some prior art connectors, a gold bond wire is used to form the contact element. However, such a structure results in gross material and cross-sectional discontinuities and impedance mismatch at the interface between the contact element and the underlying metal connections, resulting in undesirable electrical characteristics and poor high frequency operations. The contact element of the present invention does not suffer from the limitations of the conventional connector systems and a connector built using the contact elements of the present invention can be used in demanding high frequency and high performance applications.

As described above, when the contact elements of the connector of the present invention are formed using semiconductor fabrication processes, contact elements having a variety of mechanical and electrical properties can be formed. In particular, the use of semiconductor fabrication processing steps allows a connector to be built to include contact elements having different mechanical and/or electrical properties.

Thus, according to another aspect of the present invention, a connector of the present invention is provided with contact elements having different operating properties. That is, the connector includes heterogeneous contact elements where the operating properties of the contact elements can be selected to meet requirements in the desired application. In the present description, the operating properties of a contact element refer to the electrical, mechanical and reliability properties of the contact element. By incorporating contact elements with different electrical and/or mechanical properties, the connector of the present invention can be made to meet all of the stringent electrical, mechanical and reliability requirements for high-performance interconnect applications.

According to one embodiment of the present invention, the following mechanical properties can be specifically engineered for a contact element or a set of contact elements to achieve certain desired operational characteristics. First, the contact force for each contact element can be selected to ensure either a low resistance connection for some contact elements or a low overall contact force for the connector. Second, the elastic working range of each contact element over which the contact element operates as required electrically can be varied between contact elements. Third, the vertical height of each contact element can be varied. Fourth, the pitch or horizontal dimensions of the contact element can be varied.

According to alternate embodiments of the present invention, the electrical properties can be specifically engineered for a contact element or a set of contact elements to achieve certain desired operational characteristics. For instance, the DC resistance, the impedance, the inductance and the current carrying capacity of each contact element can be varied between contact elements. Thus, a group of contact elements can be engineered to have lower resistance or a group of contact elements can be engineered to have low inductance.

In most applications, the contact elements can be engineered to obtain the desired reliability properties for a contact element or a set of contact elements to achieve certain desired operational characteristics. For instance, the contact elements can be engineered to display no or minimal performance degradation after environmental stresses such as thermal cycling, thermal shock and vibration, corrosion testing, and humidity testing. The contact elements can also be engineering to meet other reliability requirements defined by industry standards, such as those defined by the Electronics Industry Alliance (EIA).

When the contact elements in the connectors of the present invention are fabricated as a MEMS grid array, the mechanical and electrical properties of the contact elements can be modified by changing the following design parameters. First, the thickness of the curved spring portion of the contact element can be selected to give a desired contact force. For example, a thickness of about 30 microns typically gives low contact force on the order of 10 grams or less while a flange thickness of 40 microns gives a higher contact force of 20 grams for the same displacement. The width, length and shape of the curved sprint portion can also be selected to give the desired contact force.

Second, the number of curved spring portions to include in a contact element can be selected to achieve the desired contact force, the desired current carrying capacity and the desired contact resistance. For example, doubling the number of curved spring portions roughly doubles the contact force and current carrying capacity while roughly decreasing the contact resistance by a factor of two.

Third, specific metal composition and treatment can be selected to obtain the desired elastic and conductivity characteristics. For example, Cu-alloys, such as copper-beryllium, can be used to provide a good tradeoff between mechanical elasticity and electrical conductivity. Alternately, metal multi-layers can be used to provide both excellent mechanical and electrical properties. In one embodiment, a contact element is formed using titanium (Ti) coated with copper (Cu) and then with nickel (Ni) and finally with gold (Au) to form a Ti/Cu/Ni/Au multilayer. The Ti will provide excellent elasticity and high mechanical durability while the Cu provides excellent conductivity and the Ni and Au layers provide excellent corrosion resistance. Finally, different metal deposition techniques, such as plating or sputtering, and different metal treatment techniques, such as alloying, annealing, and other metallurgical techniques can be used to engineer specific desired properties for the contact elements.

Fourth, the curvature of the curved spring portion can be designed to give certain electrical and mechanical properties. The height of the curved spring portion, or the amount of projection from the base portion, can also be varied to give the desired electrical and mechanical properties.

Figure 10A:
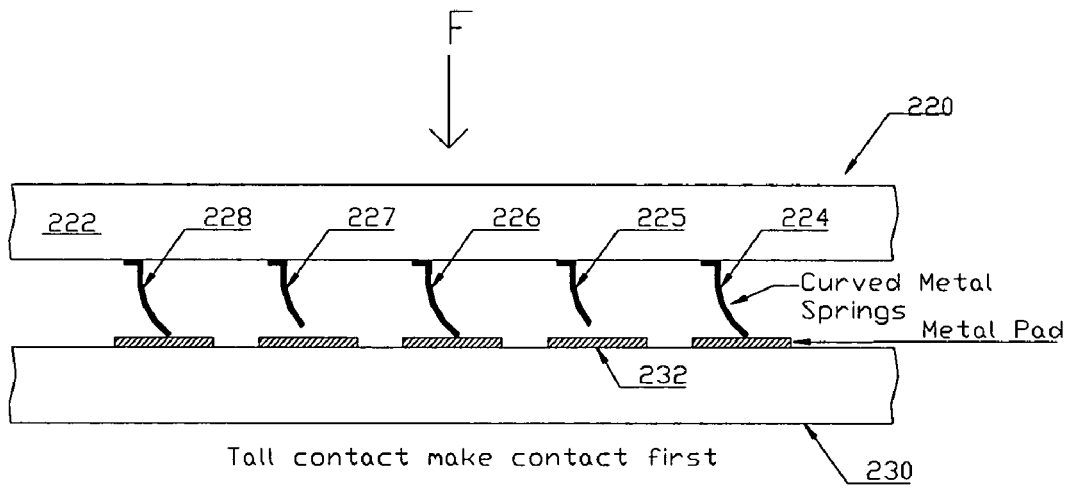
FIGS. 10A and 10B are cross-sectional views of a connector according to an alternate embodiment of the present invention.
Figure 10B:
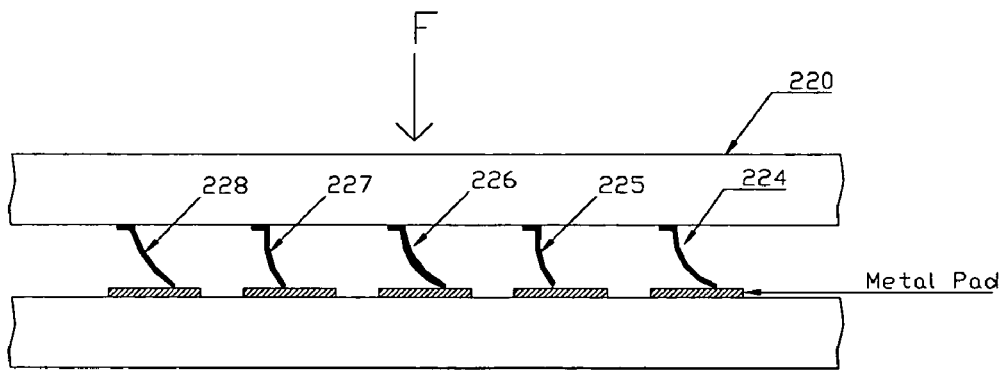

FIGS. 10A and 10B are cross-sectional views of a connector according to an alternate embodiment of the present invention. Referring to FIG. 10A, a connector 220 includes a first set of contact elements 224, 226 and 228 and a second set of contact elements 225 and 227, all formed on a substrate 222. The first set of contact elements 224, 226 and 228 has a curved spring portion longer than the curved spring portion of the second set of contact elements 225 and 227. In other words, the height of the curved spring portion of contact elements 224, 226 and 228 is greater than the height of the curved spring portion of contact elements 225 and 227.

By providing contact elements having different height, connector 220 of the present invention can be advantageously applied in "hot-swapping" applications. Hot-swapping refers to mounting or demounting a semiconductor device while the system to which the device is to be connected is electrically active without damaging to the semiconductor device or the system. In a hot-swapping operation, various power and ground pins and signal pins must be connected and disconnected in sequence and not at the same time in order to avoid damages to the device or the system. By using a connector including contact elements with different heights, taller contact elements can be use to make electrical connection before shorter contact elements. In this manner, a desired sequence of electrical connection can be made to enable hot-swapping operation.

As shown in FIG. 10A, connector 220 is to be connected to a semiconductor device 230 including metal pads 232 formed thereon. When an external biasing force F is applied to engage connector 220 with semiconductor device 230, the tall contact elements 224, 226 and 228 make contact with respective metal pads 232 first while shorter contact elements 225 and 227 remain unconnected. Contact elements 224, 226 and 228 can be used to make electrical connection to power and ground pins of semiconductor device 230. With further application of the external biasing force F (FIG. 10B), shorter contact elements 225 and 227, making connection to signal pins, can then make connection with respective metal pads 232 on device 230. Because the contact elements of the present invention have a large elastic working range, the first set of contact elements can be further compressed than the second set of contact elements without compromising the integrity of the contact elements. In this manner, connector 220 enables hot-swapping operation with semiconductor device 230.

Figure 11:
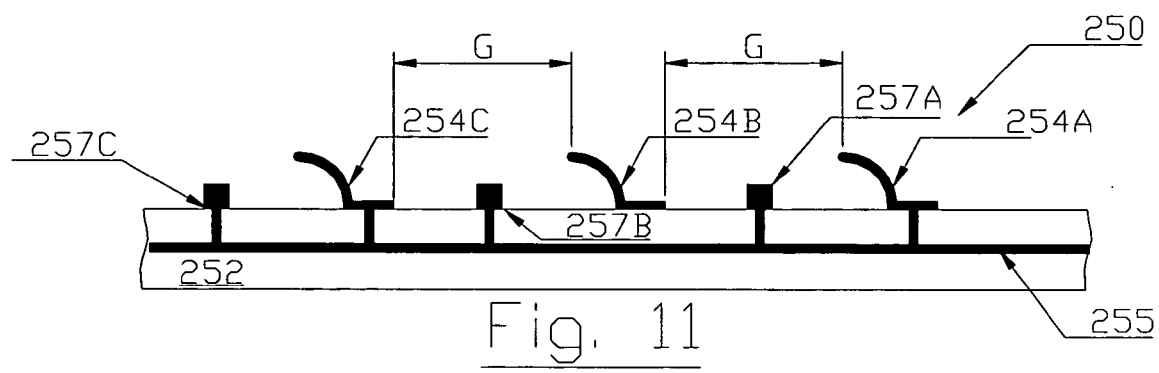
FIG. 11 is a cross-sectional view of a connector including a ground plane for improving signal integrity and for controlling contact element impedance according to one embodiment of the present invention.

According to another aspect of the present invention, a connector is provided with ground planes and the impedance of the contact elements can be controlled by varying the distance between the contact element for a signal pin and the ground plane or between the contact element for a signal pin and the contact element for a ground pin. FIG. 11 is a cross-sectional view of a connector including a ground plane for improving signal integrity and for controlling contact element impedance according to one embodiment of the present invention. Referring to FIG. 11, a connector 250 includes a contact element 254B which is to be connected to a signal pin on a semiconductor device. Connector 250 further includes contact elements 254C which is to be connected to the ground potential of the semiconductor device. Connector 250 includes a ground plane 255 which is formed in substrate 252. Ground plane 255 can be formed on the top surface of substrate 252 or embedded in substrate 252. In FIG. 11, the connection between contact elements 254A and 254C and ground plane 255 is shown. In actual implementation, contact elements 254A and 254C can be connected to ground plane 255 through metal connection on the surface of substrate 252 or through metal connection embedded in substrate 252.

The inclusion of ground plane 255 in connector 250 has the effect of improving the signal integrity of the AC electrical signals that are connected through connector 250. Specifically, as integrated circuits are being operated at higher and higher frequencies while the package lead count increases with decreasing lead pitches, the ability to improve signal integrity in a connector used to interconnect such integrated circuits becomes more important. In accordance with the present invention, connector 250 includes ground plane 255 which functions to reduce noise and improve signal integrity of the connector. Furthermore, in the configuration shown in FIG. 11, the distance G between contact element 254B for a signal pin and contact elements 254A and 254C for the ground potential can be varied to obtain a desired impedance for contact element 254B. Elements 257A, 257B and 257C can be included to further control the Electromagnetic emissions and rejection characteristic of the connector.

Figure 12:
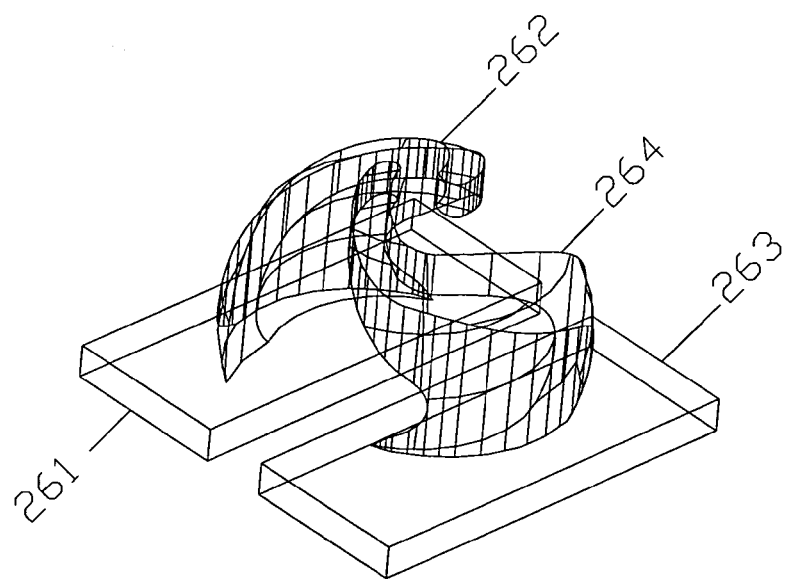
FIG. 12 illustrates another embodiment of the connector of the present invention where a pair of contact elements is used to couple to a pair of differential signals.

FIG. 12 illustrates another embodiment of the connector of the present invention where a pair of contact elements 262 and 264 is used to couple to a pair of differential signals. In the present embodiment, contact elements 262 and 264 are each formed as including separate base portions 261 and 263. In this manner, a connector including contact elements 262 and 264 can be used to contact a semiconductor device including a pair of differential signals.

According to another aspect of the present invention, a connector incorporates embedded thermal dissipation structures to provide enhanced heat dissipation capability at specific contact elements. For instance, when a contact element engaging a lead of an electronic package carries more than 1A of current, significant Joule heating can result creating a temperature rise of 20 degrees or more at the contact element. In accordance with the present invention, a connector includes embedded thermal dissipation structures so as to effectively limit the temperature rise at specific contact elements. For example, the amount of temperature rise can be reduced to 10 degrees or less by the use of the embedded thermal dissipation structures in the connector of the present invention.

Figure 13:
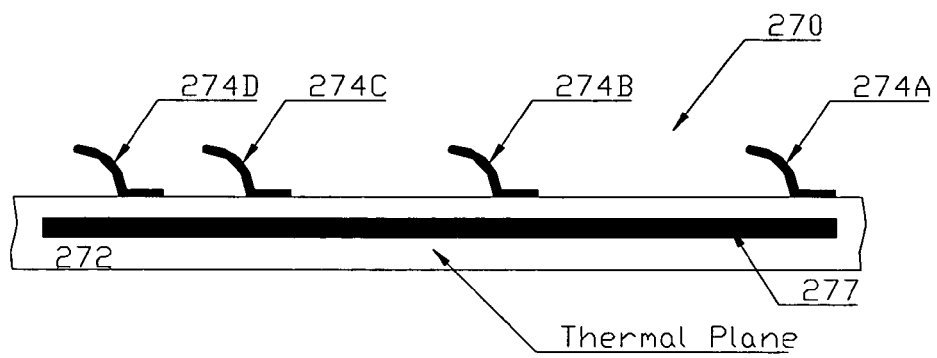
FIG. 13 illustrates a connector incorporating a thermally conductive plane according to one embodiment of the present invention.

FIG. 13 illustrates a connector incorporating a thermally conductive plane according to one embodiment of the present invention. Referring to FIG. 13, connector 270 includes contact elements 274A to 274D formed on the top surface of a substrate 272. A thermally conductive plane 277 is formed in substrate 272 during the manufacturing process of substrate 272. Thermally conductive plane 277 provides heat dissipation function for contact elements 274A to 274D. In one embodiment, the thermally conductive plane is formed using Cu. In another embodiment, the thermally conductive plane is formed using a filled epoxy which is not electrically conductive and thus can be in intimate contact with any circuitry that may be present in substrate 272 and connected to contact elements 274A to 274D. In operation, thermally conductive plane 288 dissipates heat generated at the contact elements when the contact elements are coupled to a semiconductor device and are subjected to Joule heating.

Figure 14:
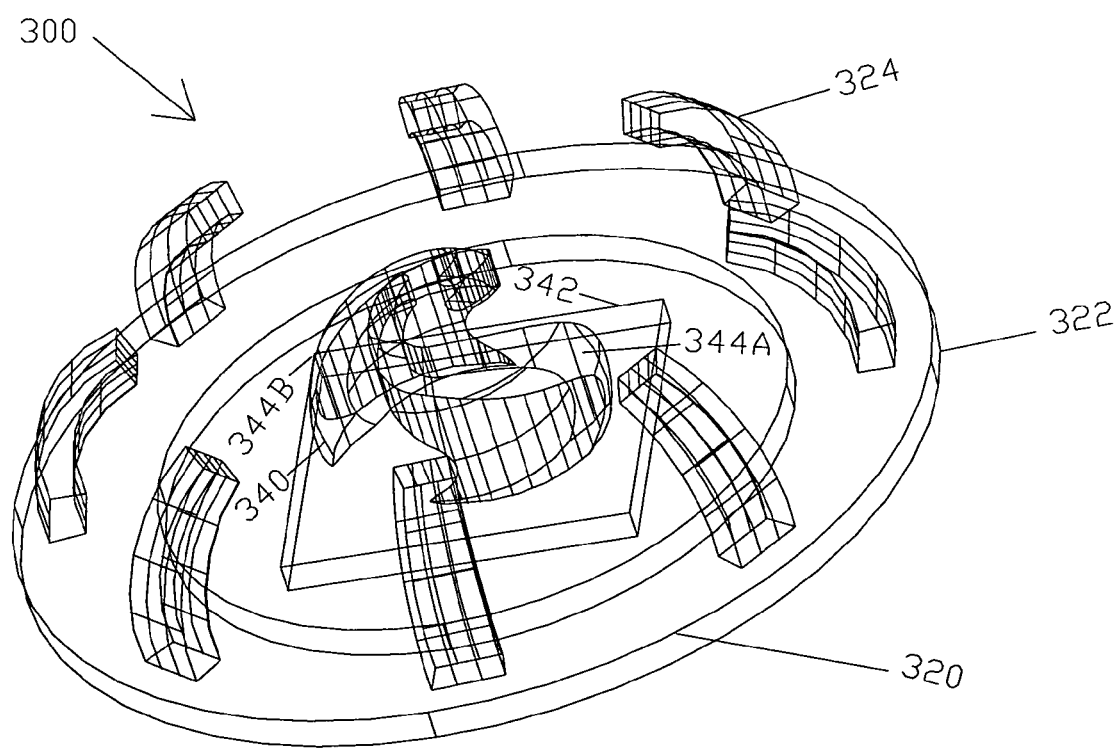
FIG. 14 is a cross-sectional view of a connector including a coaxial contact element according to one embodiment of the present invention.

According to yet another aspect of the present invention, a connector includes one or more coaxial contact elements. FIG. 14 illustrates a connector 300 including a coaxial contact element according to one embodiment of the present invention. Referring to FIG. 14, connector 300 includes a first contact element 320 and a second contact element 340 formed on the top surface of a substrate. Contact elements 320 and 340 are formed in proximity to but electrical isolated from each other. In the present embodiment, contact element 320 includes a base portion 322 formed as an outer ring including an aperture while contact element 340 includes a base portion 342 formed inside the aperture. Each of contact elements 320 and 340 includes multiple curves spring portions. Specifically, contact element 320 includes eight curved spring portions 324 dispersed along the circular base portion 322. Curved spring portions 324 are formed linear projection from the base portion. On the other hand, contact element 340 includes two curved spring portions 344A and 344B, each curved spring portion projecting in a spiral configuration from the base portion.

The curved spring portions of contact element 320 do not overlap with the curved spring portions of contact element 340. Thus, contact element 320 is electrically isolated from contact element 340. As thus constructed, connector 300 can be used to interconnect a coaxial connection on a semiconductor device. Typically, the outer contact element is coupled to a ground potential connection while the inner contact element is coupled to a signal connection, such as a high frequency signal. A particular advantage of the connector of the present invention is that the coaxial contact elements can be scaled to dimensions of 250 microns or less. Thus, the connector of the present invention can be used to provide coaxial connection even for small geometry electronic components.

According to another aspect of the present invention, each of the contact elements of the connector further includes a conductive adhesion layer in the base portion of the contact element for improving the adhesion of the contact element to the substrate. FIGS. 15A to 15H illustrate the processing steps for forming an array of connectors according to an alternate embodiment of the present invention. Like elements in FIGS. 7A to 7H and 15A to 15H are given like reference numerals to simplify the discussion.

Figure 15A:
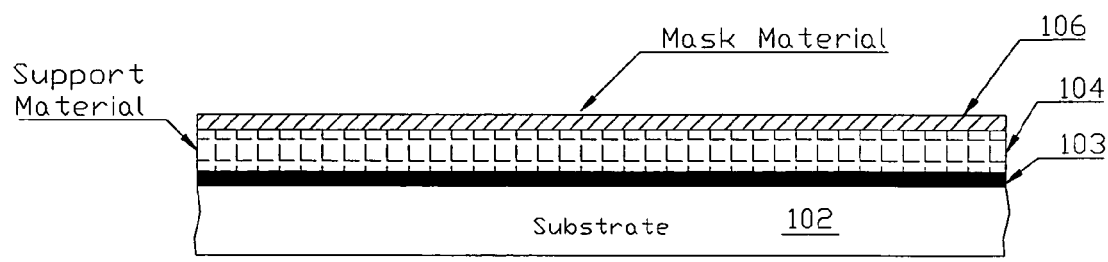
FIGS. 15A to 15H illustrate the processing steps for forming an array of connectors according to an alternate embodiment of the present invention.
Figure 15B:
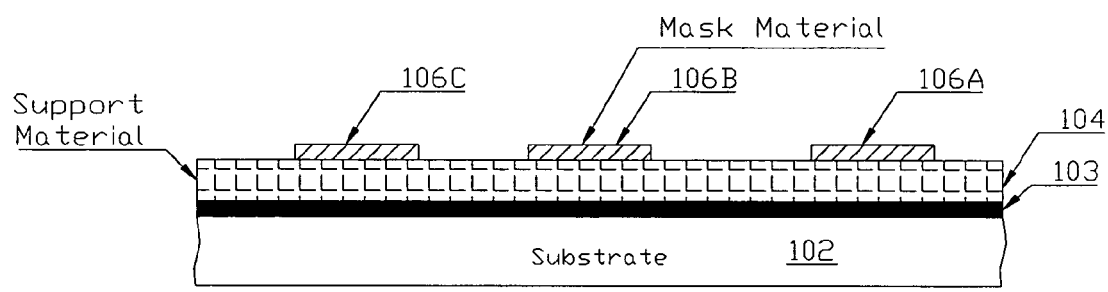

Referring to FIG. 15A, a substrate 102 on which the contact elements are to be formed is provided. Substrate 102 can be a silicon wafer or ceramic wafer and may include a dielectric layer formed thereon (not shown in FIG. 15A). A conductive adhesion layer 103 is deposited on substrate 102 or on top of the dielectric layer if present. Conductive adhesion layer 103 can be a metal layer, such as copper-beryllium (CuBe) or titanium (Ti), or a conductive polymer-based adhesive, or other conductive adhesive. Then, a support layer 104 is formed on the adhesion layer 103. Support layer 104 can be a deposited dielectric layer, such as an oxide or nitride layer, a spin-on dielectric, a polymer, or any other suitable etchable material.

After the support layer 104 is deposited, a mask layer 106 is formed on the top surface of support layer 104. Mask layer 106 is used in conjunction with a conventional lithography process to define a pattern on support layer 104 using mask layer 106. After the mask layer is printed and developed (FIG. 15B), a mask pattern, including regions 106A to 106C, is formed on the surface of support layer 104 defining areas of support layer 104 to be protected from subsequent etching.

Figure 15C:
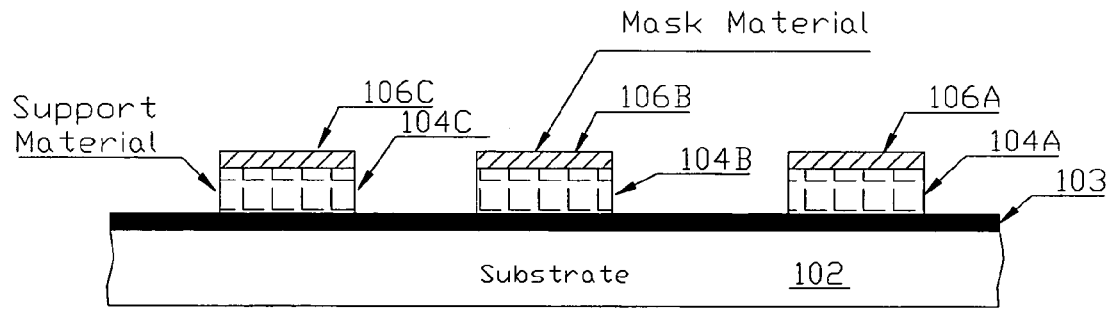
Figure 15D:
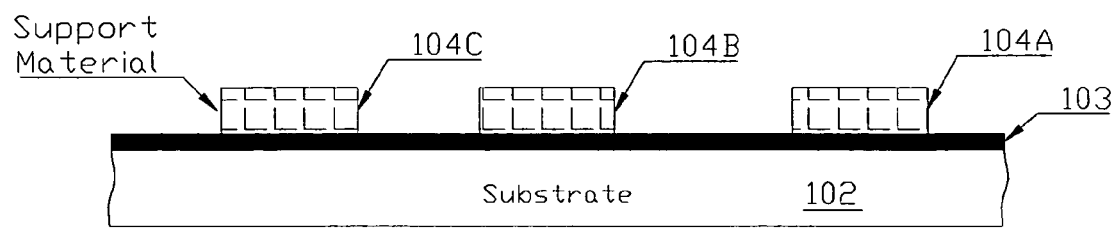

Referring to FIG. 15C, an anisotropic etching process is performed using regions 106A to 106C as a mask. As a result of the anisotropic etching process, support layer 104 not covered by a patterned mask layer is removed. The anisotropic etching process stops on conductive adhesion layer 103 or partially in conductive adhesion layer 103. Thus, conductive adhesion layer 103 remains after the anisotropic etch process. Accordingly, support regions 104A to 104C are formed on the conductive adhesion layer. The mask pattern including regions 106A to 106C is subsequently removed to expose the support regions (FIG. 15D).

Figure 15E:
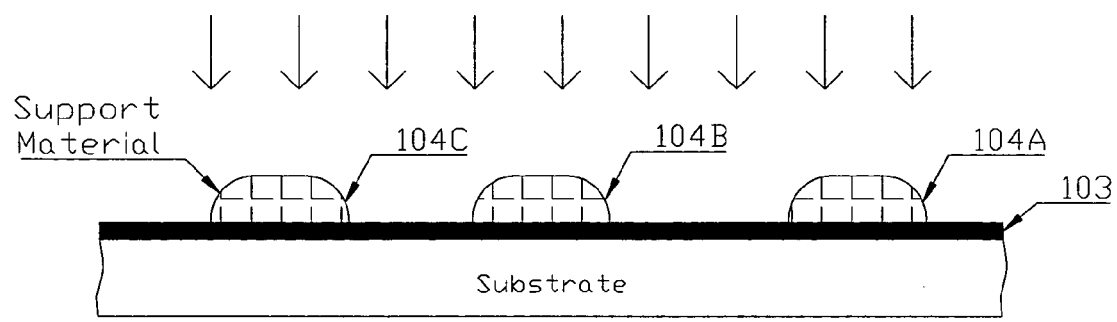

Referring to 15E, support regions 104A to 104C are then subjected to an isotropic etching process. An isotropic etching process remove material under etch in the vertical and horizontal directions at substantially the same etch rate. Thus, as a result of the isotropic etching, the top corners of support regions 104A to 104C are rounded off as shown in FIG. 15E.

Figure 15F:
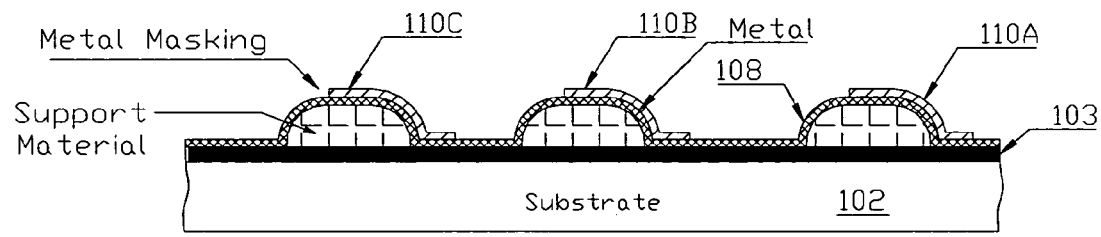

Then, referring to FIG. 15F, a metal layer 108 is formed on the surface of conductive adhesion layer 103 and the surface of support regions 104A to 104C. Metal layer 108 can be a copper layer or a copper-alloy (Cu-alloy) layer or a multilayer metal deposition such as Tungsten coated with Copper-Nickel-Gold (Cu/Ni/Au). In a preferred embodiment, the contact elements are formed using a small-grained copper-beryllium (CuBe) alloy and then plated with electroless Nickel-Gold (Ni/Au) to provide a non-oxidizing surface. Metal layer 108 can be deposited by a CVD process, by electro plating, by sputtering, by physical vapor deposition (PVD) or using other conventional metal film deposition techniques. A mask layer is deposited and patterned into mask regions 110A to 110C using a conventional lithography process. Mask regions 110A to 110C define areas of metal layer 108 to be protected from subsequent etching.

Figure 15G:
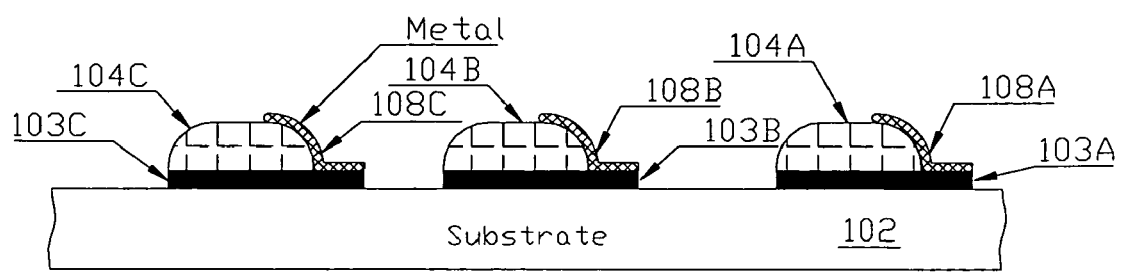

Then, the structure in FIG. 15F is subjected to an etching process for removing metal layer and conductive adhesion layer not covered by mask regions 110A to 110C. As a result, metal portions 108A to 108C and conductive adhesion portions 103A to 103C are formed as shown in FIG. 15G. Each of metal portions 108A to 108C includes a base portion formed on a respective conductive adhesion portion and a curved spring portion formed on a respective support region (104A to 104C). Accordingly, the curved spring portion of each metal portion assumes the shape of the underlying support region, projecting above the substrate surface and having a curvature that provides a wiping action when applied to contact a contact point. The base portion of each metal portion is attached to a respective conductive adhesion portion which functions to enhance the adhesion of each base portion to substrate 102.

Figure 15H:
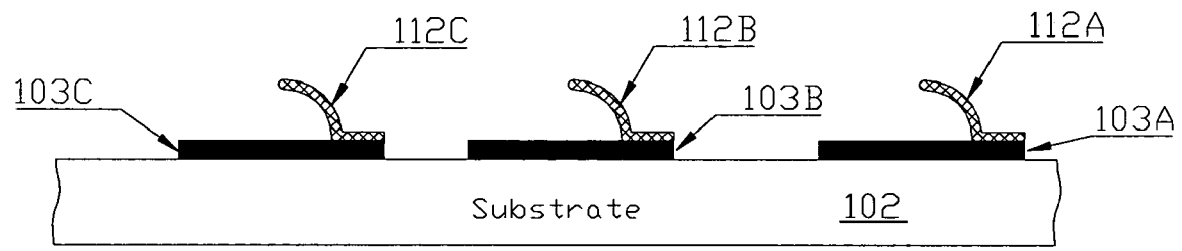

To complete the connector, support regions 104A to 104C are removed (FIG. 15H), such as by using a wet etch or an anisotropic plasma etch or other etch process. If the support layer is formed using an oxide layer, a buffered oxide etchant can be used to remove the support regions. As a result, free standing contact elements 112A to 112C are formed on substrate 102. As thus formed, each of contact elements 112A to 112C effectively includes an extended base portion. As shown in FIG. 15H, each conductive adhesion portion serves to extend the surface area of the base portion to provide more surface area for attaching the contact element to substrate 102. In this manner, the reliability of the contact elements can be improved.

The above detailed descriptions are provided to illustrate specific embodiments of the present invention and are not intended to be limiting. Numerous modifications and variations within the scope of the present invention are possible. For example, one of ordinary skill in the art would appreciate that references to the "top" and "bottom" surfaces of a structure are illustrative only and the "top" and "bottom" references are merely used to refer to the two opposing major surfaces of the structure. Furthermore, while the above description refers to the use of the connector of the present invention for connecting to wafers, to LGA packages and to BGA packages, one of ordinary skill in the art would appreciate that the connector of the present invention can be used as an interconnect for any types of area array formed using pads or lands or solder balls as the electrical connections or the contact points. The references to specific types of semiconductor device to be connected are illustrative only. The present invention is defined by the appended claims.

We claim:

1. A connector for electrically connecting to pads formed on a semiconductor device, comprising:
   a substrate;
   an electrical circuit embedded within the substrate, a surface of the substrate exposing an exposed portion of the embedded electrical circuit:
   a plurality of electrically conductive contact elements disposed on the surface of the substrate, at least one of said contact elements comprising
     a base portion adhered to the substrate by a conductive adhesion layer and
     a spring portion projecting away from the substrate, the conductive adhesion layer adhered to the exposed portion of the embedded electrical circuit and extending along the substrate underneath and apart from the spring portion;
   the electrical circuit being electrically connected to the at least one of said contact elements through the conductive adhesion layer, and
   the at least one of said contact elements formed on and electrically connected to the conductive adhesion layer by metal film deposition.

2. The contact elements of claim 1 separated by a pitch of less than 250 microns.

3. The contact elements of claim 1 in vertical alignment with respective pads of the semiconductor device.

4. The contact elements of claim 1 coated with a conductive material.

5. The contact elements of claim 1 made from a material selected from the group of copper, copper alloy, small-grained copper-beryllium (CuBe) alloy, and a stainless steel/Cu/Ni/Au multilayer.

6. The contact elements of claim 1 having two or more curved portions.

7. The contact elements of claim 1 being of at least two types, a first type having a mechanical property different from a mechanical property of a second type.

8. The contact elements and portions of the electrical circuit of claim 1 formed using a metal layer of the same type.

9. The electrical circuit of claim 1 including at least one of an interconnected metal layer, a capacitor, and an inductor.

10. The connector of claim 1, the metal film deposition providing an integral construction between the contact element and the conductive adhesion layer such that a continuous electrical path is formed between the contact element and the electrical circuit, without metal discontinuity and impedance mismatch.

11. The connector of claim 1, the electrical circuit being completely embedded within the substrate except for the exposed portion.

12. The connector of claim 1, the electrical circuit including a capacitor embedded within the substrate.

13. The connector of claim 1, the electrical circuit including an inductor embedded within the substrate.

14. The connector of claim 1, the conductive adhesion layer comprising one of copper-beryllium, titanium, and a polymer-based conductive adhesive.

15. The contact elements of claim 1 having curvature.

16. The contact elements of claim 15 having a wiping surface that is up to approximately 50% of a second surface to which it is wiped.

17. The connector of claim 1, the plurality of electrically conductive contact elements connected to solder balls formed on the semiconductor device, the solder balls having a pitch of less than 250 microns.

18. The contact elements of claim 17 having a plane of contact tangent to a side surface of the solder balls.

19. The connector of claim 1, the at least one of said contact elements comprising a first contact element,
    the surface of the substrate exposing a second exposed portion of the embedded electrical circuit,
    a second contact element of the plurality of electrically conductive contact elements electrically connected to a conductive adhesion layer by metal film deposition, the conductive adhesion layer adhered to the second exposed portion,
    the first contact element and the second contact element disposed on the same side of the substrate, and
    the first contact element, the electrical circuit, and the second contact element being contiguous such that a continuous electrical path is formed between the first contact element and the second contact element, without metal discontinuity and impedance mismatch.

20. The connector of claim 19, a third contact element of the plurality of conductive contact elements formed on the same side of the substrate as the first contact element and the second contact element, the third contact element being electrically isolated from the first contact element, the second contact element, and the electrical circuit.

21. A connector for electrically connecting to solder balls of a ball grid array device, comprising:
    a substrate;
    an electrical circuit embedded within the substrate, a surface of the substrate exposing an exposed portion of the embedded electrical circuit;
    a plurality of electrically conductive contact elements disposed on the surface of the substrate, at least one of said contact elements comprising
      a base portion adhered to the substrate by a conductive adhesion layer and
      a spring portion projecting away from the substrate, the conductive adhesion layer adhered to the exposed portion of the embedded electrical circuit and extending along the substrate underneath and apart from the spring portion;
    the electrical circuit being electrically connected to the at least one of the said contact elements through the conductive adhesion layer, and
    the at least one of said contact elements formed on and electrically connected to the conductive adhesion layer by metal film deposition.

22. A plane of contact of the contact elements of claim 21 being a plane tangent to a side surface of the solder balls being contacted.

23. The base portion and the spring portion of the contact elements of claim 21 are a contiguous structure made from the same conductive material.

24. The base portion and the spring portion of the contact elements of claim 21 are formed using a first conductive metal and a second conductive metal, respectively, the first and second conductive metals being different from each other.

25. The contact elements of claim 21 are made from a material selected from the group of copper, copper alloy, small-grained copper-beryllium (CuBe) alloy, and a stainless steel/Cu/Ni/Au multilayer.

26. The electrical circuit of claim 21 formed by one or more metal layers embedded within the substrate.

27. The contact elements and at least portions of the electrical circuit of claim 21 being formed of a metal of the same type.

28. The electrical circuit of claim 21 including at least one of an interconnected metal layer, a capacitor, and an inductor.

29. The connector of claim 21, the metal film deposition providing an integral construction between the contact element and the conductive adhesion layer such that a continuous electrical path is formed between the contact element and the electrical circuit, without metal discontinuity and impedance mismatch.

30. The connector of claim 21, the electrical circuit being completely embedded within the substrate except for the exposed portion.

31. The connector of claim 21, the electrical circuit including a capacitor embedded within the substrate.

32. The connector of claim 21, the electrical circuit including an inductor embedded within the substrate.

33. The connector of claim 21, the conductive adhesion layer comprising one of copper-beryllium, titanium, and a polymer-based conductive adhesive.

34. The connector of claim 21, the at least one of said contact elements comprising a first contact element,
the surface of the substrate exposing a second exposed portion of the embedded electrical circuit,
a second contact element of the plurality of electrically conductive contact elements electrically connected to a conductive adhesion layer by metal film deposition, the conductive adhesion layer adhered to the second exposed portion,
the first contact element and the second contact element disposed on the same side of the substrate, and
the first contact element, the electrical circuit, and the second contact element being contiguous such that a continuous electrical path is formed between the first contact element and the second contact element, without metal discontinuity and impedance mismatch.

35. The connector of claim 34, a third contact element of the plurality of conductive contact elements formed on the same side of the substrate as the first contact element and the second contact element, the third contact element being electrically isolated from the first contact element, the second contact element, and the electrical circuit.

* * * * *

UNITED STATES PATENT AND TRADEMARK OFFICE
CERTIFICATE OF CORRECTION

PATENT NO. : 7,244,125 B2 Page 1 of 1
APPLICATION NO. : 10/731669
DATED : July 17, 2007
INVENTOR(S) : Brown et al.

It is certified that error appears in the above-identified patent and that said Letters Patent is hereby corrected as shown below:

In column 19, line 16, in Claim 1, delete "circuit:" and insert -- circuit; --, therefor.

In column 20, line 55, in Claim 21, after "of" delete "the".

Signed and Sealed this

Thirteenth Day of November, 2007

JON W. DUDAS
*Director of the United States Patent and Trademark Office*